US007646063B1

(12) United States Patent
Boyd et al.

(10) Patent No.: US 7,646,063 B1
(45) Date of Patent: Jan. 12, 2010

(54) COMPACT CMOS ESD LAYOUT TECHNIQUES WITH EITHER FULLY SEGMENTED SALICIDE BALLASTING (FSSB) IN THE SOURCE AND/OR DRAIN REGIONS

(75) Inventors: Graeme B. Boyd, North Vancouver (CA); William M. Lye, Coquitlam (CA); Xun Cheng, Coquitlam (CA)

(73) Assignee: PMC-Sierra, Inc., Santa Clara, CA (US)

( * ) Notice: Subject to any disclaimer, the term of this patent is extended or adjusted under 35 U.S.C. 154(b) by 11 days.

(21) Appl. No.: 11/451,610

(22) Filed: Jun. 12, 2006

Related U.S. Application Data

(60) Provisional application No. 60/690,701, filed on Jun. 15, 2005.

(51) Int. Cl.
*H01L 23/62* (2006.01)
(52) U.S. Cl. ................. 257/355; 257/E27.046
(58) Field of Classification Search ............. 257/355, 257/360, E27.046; 438/155
See application file for complete search history.

(56) References Cited

U.S. PATENT DOCUMENTS

| | | | |
|---|---|---|---|
| 5,493,142 A | 2/1996 | Randazzo et al. | |
| 5,721,439 A | 2/1998 | Lin | |
| 5,742,083 A | 4/1998 | Lin | |
| 5,763,919 A * | 6/1998 | Lin | 257/360 |
| 5,831,316 A | 11/1998 | Yu et al. | |
| 5,903,030 A | 5/1999 | Kim | |
| 5,982,600 A * | 11/1999 | Cheng | 361/111 |
| 6,046,087 A | 4/2000 | Lin et al. | |
| 6,064,095 A * | 5/2000 | Fu | 257/355 |
| 6,096,609 A | 8/2000 | Kim et al. | |
| 6,100,127 A | 8/2000 | Wu | |

(Continued)

FOREIGN PATENT DOCUMENTS

WO     WO 01/50533 A1     7/2001

OTHER PUBLICATIONS

Oh, Duvvury, Salling, Banerjee and Dutton; Non-Uniform Bipolar Conduction in Single Finger NMOS Transistors and Implications for Deep Submicron ESD Design; IEEE 01CH37167. 39$^{th}$ Annual International Reliability Physics Symposium (IRPS), Orlando, Florida, Institute of Electrical and Electronics Engineers (IEEE); (Apr. 30-May 3, 2001); pp. 226-234.

(Continued)

*Primary Examiner*—Thao P. Le
(74) *Attorney, Agent, or Firm*—Knobbe Martens Olson & Bear LLP

(57) ABSTRACT

Transistor structures for relatively even current balancing within a device and methods for fabricating the same are disclosed. These devices can be used in relatively compact MOSFET Electrostatic Discharge (ESD) protection structures, such as in snapback devices. One embodiment utilizes a salisided exclusion layer for segmentation of the source and/or drain diffusion areas, while the others utilize poly for segmentation of the source and/or drain area. Also, diffusion is used generically herein and, for example, includes implants. These techniques provide relatively good ESD tolerance while consuming a relatively small amount of area, and provide significant area and parasitic capacitance reduction over the state of the art without sacrificing ESD performance. These techniques are also applicable to current balancing within relatively high current devices, such as drivers.

13 Claims, 16 Drawing Sheets

U.S. PATENT DOCUMENTS

| | | |
|---|---|---|
| 6,110,771 A | 8/2000 | Ahn |
| 6,153,913 A * | 11/2000 | Hsu et al. .................. 257/355 |
| 6,236,073 B1 | 5/2001 | Hsu |
| 6,310,380 B1 | 10/2001 | Cai et al. |
| 6,373,109 B1 | 4/2002 | Ahn |
| 6,388,292 B1 | 5/2002 | Lin |
| 6,476,449 B1 * | 11/2002 | Lin ........................... 257/360 |
| 6,479,870 B1 | 11/2002 | Chen et al. |
| 6,504,216 B1 * | 1/2003 | Tang et al. .................. 257/355 |
| 6,534,834 B1 | 3/2003 | Ashton et al. |
| 6,559,503 B2 | 5/2003 | Wendel et al. |
| 6,559,507 B1 | 5/2003 | Vashchenko et al. |
| 6,583,972 B2 | 6/2003 | Verhaege et al. |
| 6,587,320 B1 | 7/2003 | Russ et al. |
| 6,642,088 B1 * | 11/2003 | Yu ............................. 438/155 |
| 6,750,517 B1 | 6/2004 | Ker et al. |
| 6,838,708 B2 | 1/2005 | Lin et al. |
| 6,963,111 B2 | 11/2005 | Reddy et al. |
| 7,098,510 B2 | 8/2006 | Kodama et al. |
| 2002/0033507 A1 | 3/2002 | Verhaege et al. |
| 2002/0074602 A1 | 6/2002 | Lin et al. |
| 2002/0074603 A1 | 6/2002 | Lin |
| 2002/0175377 A1 | 11/2002 | Lin |
| 2003/0052367 A1 | 3/2003 | Lin |
| 2003/0067040 A1 | 4/2003 | Chen et al. |

OTHER PUBLICATIONS

Oh, Duvvury, Salling, Banerjee and Dutton; Investigation of Gate to Contact Spacing Effect on ESD Robustness of Salicided Deep Submicron Single Finger NMOS Transistors; 40$^{th}$ Annual International Reliability Physics Symposium, Dallas, Texas, Institute of Electrical and Electronics Engineers (IEEE) (Apr. 2002); pp. 148-155.

Quirk and Serda; *Semiconductor Manufacturing Technology*; Prentice-Hall, Inc.; Upper Saddle River, New Jersey; 2001; pp. 309-312.

* cited by examiner

Equivalent Model
PRIOR ART

COMPACT CMOS ESD LAYOUT TECHNIQUES WITH EITHER FULLY SEGMENTED SALICIDE BALLASTING (FSSB) IN THE SOURCE AND/OR DRAIN REGIONS

CROSS-REFERENCE TO RELATED APPLICATION

This application claims the benefit under 35 U.S.C. § 119 (e) of U.S. Provisional Application No. 60/690,701, filed Jun. 15, 2005, the entirety of which is hereby incorporated by reference.

BACKGROUND

1. Field of the Invention

The invention generally relates to circuits, and in particular, to electrostatic discharge protection for circuits. Embodiments of the invention apply to all fields using CMOS processes (including BICMOS where CMOS ESD clamps are used).

2. Description of the Related Art

Electrostatic Discharge (ESD) is a major source of reliability failures in integrated circuits (ICs). For example, ESD arises when electrostatic charge accumulated on an object, for example a human body or a piece of equipment, is conducted onto another object, for example, a circuit board. This conduction of charge often results in damage to ICs, whether through electrical over-voltage stress or through thermal stress caused by large currents.

While it is possible to reduce the severity of an ESD event by reducing the build up of electrostatic charge potential, by, for example, controlling humidity in lab environments, the potential is difficult to completely mitigate. As a result, ICs incorporate ESD protection structures, allowing them to tolerate a certain level of ESD in order not to create reliability hazards. How an integrated circuit is assembled along with how the ESD protection structures are assembled is often referred to as an ESD protection strategy.

A representative ESD protection strategy, illustrating the protection of a device incorporating a single input/output (I/O) bond site and a single power and ground rail, is shown in FIG. 1. Three bond sites, one for the positive power supply VDD, one for the negative power supply VSS, and one for a signal labeled Signal are drawn at the left. Signal is protected to both VDD and VSS by primary clamp structures. A series resistor $R_{ESD}$ and secondary positive and negative clamps further reduce the voltage applied as input to the I/O circuitry. The I/O circuitry is operatively coupled to the device core circuitry. A power clamp is placed between the VDD and VSS rails. Not all ESD protection strategies will include all of these components, and more complex strategies involving multiple positive and/or negative supply rails can include even more components. However the schematic of FIG. 1 illustrates the major components of an ESD protection strategy.

The various clamps of the circuit in FIG. 1 shunt the ESD current away from the I/O circuitry and the core circuitry, providing a low-impedance path through the device, thereby avoiding over-voltage stress on the I/O and core circuitry. In addition, the clamps themselves should be able to handle the ESD current without damage from thermal over-stress caused by large ESD currents.

However, including the ESD protection strategy into an IC comes at a significant cost, both in area (cost) and in performance (speed and signal integrity). Because the various clamps are often physically large, the ESD protection strategy can be a significant fraction of the total area for an integrated circuit. Therefore, the cost of the integrated circuit is directly impacted by the requirement for ESD tolerance. Additionally, because the clamps are physically large, they can exhibit significant parasitic capacitances, which act to reduce the speed at which a signal can be driven. This parasitic capacitance also can cause signal integrity issues on signal traces due to increased reflections. Accordingly, it is desirable to reduce the size of an ESD clamp.

In CMOS circuitry, four main structures are commonly used for constructing ESD clamps. These structures are (1) Diodes; (2) "Big FET" MOS devices; (3) "Snapback" MOS devices; and (4) Silicon Controlled Rectifiers (SCRs).

The simplest structure is the diode. A diode is commonly fabricated as a simple P-N junction (for example, a p-type diffusion region in an n-well or an n-type diffusion region in a p-well). As used herein, a well is a lightly doped region and a diffusion region is a heavily doped region. A diode structure is simple, has a very high current carrying capacity per unit area, and is easy to simulate. In many respects, the diode is close to an ideal clamp, but usually only in one direction (the other direction can also clamp depending on the type of diode—for example a Zener diode can clamp in both directions, but this is not commonly used in a CMOS process). As a result, most realizable ESD protection strategies that use diodes also use one or more of the other structures.

A structure using MOS devices for ESD clamps, known as the "Big FET" approach, uses a trigger circuit to turn on a relatively large MOS device (MOSFET) to conduct current during the ESD event. This approach is particularly attractive from a simulation perspective because no parasitic devices are involved, so that a Big FET ESD Clamp can be readily simulated in a standard SPICE-compatible simulator. However, a MOS device is a surface conduction device (unlike the bulk conduction of the snapback and SCR devices) and its current carrying capacity is relatively small per unit area. Because of this, the area used by a Big FET structure is often significantly larger than that used for either the snapback or SCR structures.

Another approach for ESD clamping with MOS devices uses what is called the "snapback" device. This approach makes use of the parasitic lateral NPN bipolar device that is inherent to an NMOS device. During an ESD event, the parasitic NPN bipolar transistor turns on, conducting the ESD current. This bulk conduction permits a snapback device to conduct more current per unit area than a surface-conduction device, such as used with the Big FET approach. The use of a snapback device is also attractive because the snapback device can be made self-triggering and can also be used as the output device for standard CMOS I/O structures, thereby making so-called "self-protecting" I/O's. However, the snapback device has a weakness: the parasitic bipolar transistor has significant variation from device to device within a multi-finger structure, and also across the width of a single finger. These variations mean that current is typically not equally distributed across the device. Furthermore, these types of devices have a tendency to become more conductive the hotter they get, which means that unless steps are taken to prevent it, the hotter spots in the clamp will conduct relatively more ESD current, which can cause a localized failure in the clamp. In order to prevent this, a current ballast structure can be inserted into the drain of the NMOS device to ensure even spreading of the ESD current. This ballast structure can increase the size and cost of the snapback device.

Another structure commonly used for ESD clamps is a Silicon-Controlled Rectifier (SCR). The SCR makes use of two parasitic bipolar transistors, an NPN and a PNP, and as a result it too has relatively large current conduction ability, potentially higher than snapback devices. However, unlike the snapback device, the self-triggering voltage for a typical SCR is typically in the 10-20V range, which is too high for the majority of applications in fine-geometry ICs. In order to overcome this limitation, SCRs use a trigger circuit to turn on during the ESD event, which complicates the design significantly. In addition, SCRs normally require more simulation and testing than snapback devices, which also complicates their use.

As a result of all this, the most common structure (after the diode) used in the industry is the snapback device. The remainder of this disclosure will focus on techniques to reduce the area used by the current spreading ballast associated with this device, which reduces the IC cost and potentially increases its performance.

The snapback device commonly used in ESD protection schemes is the parasitic NPN bipolar device that is inherent to all NMOS devices, as is shown in FIG. 2. The base of the NPN transistor is also the bulk of the NMOS device, while the emitter and collector of the NPN are the drain and source of the NMOS device, respectively.

FIGS. 3A and 3B illustrates a layout and cross sectional view of a single-finger snapback device 309 in a P-type substrate 305 complementary MOS (CMOS) technology with Shallow Trench Isolation (STI). N-type diffusion regions form a drain 301 and a source 302 for the NMOS device, while poly-silicon (also called "poly") forms a gate 303. A P-type diffusion forms the bulk tap 304, allowing connection to the P-type substrate 305. Metallic contacts 306, 307, and 308 connect to the Drain, Source, and Bulk diffusion regions, allowing connection to the rest of the circuit. The parasitic NPN transistor of the snapback device 309 is a bulk device formed from the drain 301, the bulk and the source 302 of the NMOS device, while the parasitic resistance 310 connects the base of the NPN device to the bulk tap 304.

An idealized I-V curve of a snapback device 309 of an NMOS transistor is shown in FIG. 4. During an ESD event, current into the snapback device 309 suddenly increases the voltage at the drain 301. This causes avalanche multiplication of current across the Drain/Bulk junction, which causes current to be injected into the substrate 305. This current in turn builds up a voltage across the parasitic resistance 310 until the Bulk/Source junction becomes forward-biased, turning on the parasitic NPN transistor of the snapback device 309. This happens at a voltage and current given by $V_{T1}$ and $I_{T1}$, known as the snapback trigger point. After the NPN transistor of the snapback device 309 turns on, the voltage across the device drops to $V_H$, known as the "Hold Voltage" while current flows from the drain 301 to the source 302 via the NPN transistor of the snapback device 369. The avalanche multiplication current continues to flow, maintaining the snapback. As the current continues to increase, the voltage across the NPN transistor of the snapback device 309 increases according to the device on resistance, $R_{ON}$. Unless otherwise limited, the power dissipation within the device can reach a point ($V_{T2}$, $I_{T2}$) where the heat generated by the ESD current causes thermal breakdown, which is also known as second breakdown. At this point, the device reaches its thermal limits, and undergoes destructive breakdown.

The various points in FIG. 4 are highly dependent upon several factors, including edge rate of the ESD event, dopant densities, physical dimensions, the circuitry connected to the gate 303, and the parasitic resistance 310.

Parameters of interest in the snapback I-V curve are the snapback trigger voltage $V_{T1}$ and the second breakdown current $I_{T2}$. $V_{T1}$ is the maximum voltage that the circuit being protected should experience, while $I_{T2}$ determines the ESD current protection limit.

ESD testing can be performed according to any of many discharge models, selected to model common ESD events. Models include the Human Body Model (HBM), the Charged Device Model (CDM), the Machine Model (MM), as well as some other application-specific models. Each model includes a high voltage source (typically measured in hundreds or thousands of volts) together with a discharge network that sets the shape and edge rate of the ESD current pulse. Different ESD models have different peak currents for a given ESD voltage. For example, a 2 kilovolts (kV) HBM discharge gives approximately 1.33 amps (A) of peak current, while 500 volts (V) CDM can give up to 2 amps (A) peak current (dependent on package size and type).

So long as the peak ESD current is less than the second breakdown current $I_{T2}$, the snapback device 309 should be robust and remain undamaged from an ESD event. In order to reduce the size of the snapback device 309, the scaling of the second breakdown current $I_{T2}$ with device width should be considered. Depending upon the specific characteristics of the snapback device and processing, the second breakdown current $I_{T2}$ values are normally in the 3 mA/µm to 8 mA/µm range. For example, for a 2 A peak ESD current, the width of the ESD protection device should be in the 250 to 670 micron range. However, this width is applicable for ESD protection when the entire device is conducting simultaneously, i.e., evenly.

In practical snapback ESD protection devices, there are significant variations across the width of a single-finger NMOS device. This can be modeled by segmenting the snapback device 309 into a number of smaller devices in parallel, as shown in FIG. 5. In FIG. 5, the snapback device 309 has been modeled as a number of smaller devices 501, together with drain parasitic resistances 502 and source parasitic resistances 503.

Because of both random and systematic mismatches between the individual snapback devices 501 and the parasitic resistances 502 and 503, one of the devices of the model will snap back before the others. In a single-finger snapback device, this corresponds to snapback happening on only a small portion of the device. Because of the positive feedback nature of the snapback operation, this first region to enter snapback will tend to conduct the majority of the ESD current at that point. As the current continues to grow, this first region will tend to continue to take the majority of the ESD current, holding the drain/source voltage low, which will tend to prevent the rest of the device from entering snapback. This contributes to localized current crowding and reduces the effective width of the snapback device, decreasing the overall second breakdown current $I_{T2}$ of the structure and increasing the likelihood of an ESD failure.

The parasitic resistances 502 and 503 act in a negative feedback manner to limit the current that each snapback device (or region thereof) will conduct. Each device (or region) 501 that undergoes snapback increases the current flow through its parasitic resistances 502 and 503. The drain parasitic resistances 502 increase the voltage on the common drain node above $V_H$, thereby increasing the likelihood that other devices will undergo avalanche multiplication, triggering snapback, thereby providing additional low-impedance paths for the ESD current. This negative feedback effect only helps over a limited area, based on the values of resistances, the amount of diode leakage that gets multiplied (avalanche multiplication), and local die temperature. Typically, the more compact the ESD structure, the better the current distribution due to the ballasting resistances 502, 503. There are many ways to implement these ballasting resistances 502, 503.

For example, in FIG. 6, which illustrates a conventional two-finger snapback device, the parasitic ballasting resistances 502, 503 are implemented by a diffusion area between the contacts 601, 602 for the drain and/or source and the poly gate 603. Approximate values for the two ballasting resistors are expressed in Equations 1 and 2.

$$R1 \approx Rcon_{eff} + \frac{D}{W} * \rho_{diff} \qquad \text{Equation 1}$$

$$R2 \approx Rcon_{eff} + \frac{A}{W} * \rho_{diff} \qquad \text{Equation 2}$$

In Equations 1 and 2, $\rho_{diff}$ is the sheet resistance of the diffusion region 600 and $Rcon_{eff}$ is the contact resistance divided by the number of contacts in the drain (for Equation 1) or the source (for Equation 2). Sheet resistance is often written Rs. Usually, resistance R1 is much bigger than resistance R2 and is typically connected to the pad for providing ESD protection. The values of A, B, D, L and W can be varied to control the amount of current that the snapback device can safely handle while still taking manufacturing design rules into account. For example: A is typically made to be $\geq 1.5$ times the minimum contact to gate spacing design rule of the process; L is typically between 1 to 1.2 times the minimum poly gate length for the MOS device; W is typically between 20 μm and 200 μm; B typically is $\geq 2$ times the minimum diffusion overlap of contact; and D is made such that the resistance value is large enough to spread the current relatively evenly through the device.

The style of ballasting described in connection with FIG. 6 works on non-salisided diffusion regions, i.e., a diffusion that has values of sheet resistance $\rho_{diff}$ typically over 100 Ω/square, whereas salisided diffusions typically have sheet resistance $\rho_{diff}$ under 10 Ω/square), otherwise the size of D would become fairly large, and a corresponding transistor would be relatively large.

In FIG. 7, which illustrates a two-finger snapback device, the parasitic drain ballasting resistances (R1) are implemented by the diffusion area 700 between the drain contacts 701 and the non-salisided diffusion region 704 in the area between the drain contacts 701 and the poly gate 703. The parasitic source ballasting resistances (R2) are similar to those described earlier in connection with FIG. 6 (implemented by a diffusion area between the contacts 702 and the poly gate 703). Values for the two ballasting resistances are expressed in Equations 3, 4, and 5.

$$C > 0; R1 \approx Rcon_{eff} + \frac{D}{W} * \rho_{ex-diff} + \frac{C}{W} * \rho_{diff} \qquad \text{Equation 3}$$

$$C \leq 0; R1 \approx Rcon_{eff} + \frac{D}{W} * \rho_{ex-diff} \qquad \text{Equation 4}$$

$$R2 \approx Rcon_{eff} + \frac{A}{W} * \rho_{diff} \qquad \text{Equation 5}$$

In Equations 3, 4, and 5, $\rho_{diff}$ is the sheet resistance of the diffusion region 700, $\rho_{ex-diff}$ is the sheet resistance of the non-salisided diffusion region 704 and $Rcon_{eff}$ is the contact resistance divided by the number of contacts in the drain (for Equation 3 or Equation 4) or the source (for Equation 5). Usually resistance R1 is much bigger than resistance R2 and is typically connected to the pad for which ESD protection is to be provided. The values of A, B, C, D, L and W can be varied to control the amount of current that the snapback device can safely handle while still taking manufacturing design rules into account. It should be noted that some of the variable letters used for referencing dimensions are reused in other figures and correspond to other dimensions. A is typically made to be greater than or equal to about 1.5 times the minimum contact to gate spacing design rule of the process; L is typically between 1 and 1.2 times the minimum poly gate length for the MOS device; C can be the minimum design rule for the distance between poly and the salisided exclusion layer (it should be noted that in some processes this number can be negative or zero, that is the salisided exclusion mask can overlap or touch the poly hence Equation 3 simplifies to Equation 4); W is typically between 20 μm and 200 μm; E is typically the minimum separation for a contact to a salisided exclusion; the sum of B and G is greater than or equal to the minimum width for a salisided exclusion; B is typically greater than or equal to 2 times the minimum diffusion overlap of a contact; and D is made such that the resistance value is large enough to spread the current relatively evenly through the device.

The style of ballasting described in connection with FIG. 7 can be used with devices that have salisided diffusion regions to reduce the physical size of the ballasting resistor, which reduces the cost of the corresponding integrated circuit.

FIG. 8 illustrates the use of resistors for providing ballasting resistance for a conventional two-finger snapback device. As will be described later, the principles and advantages of these resistors can also be applied with embodiments of the invention. The ballasting resistances for the circuit illustrated in FIG. 8 are more complicated than those described earlier in connection with FIG. 7.

FIG. 9 is a schematic of a more detailed model for an equivalent circuit for a snapback device that will be used to describe the conventional circuit of FIG. 8, as well as the embodiments of FIGS. 10-13. For the snapback device illustrated in FIG. 8, the ballasting resistances R1, R12, R2, and R22 modeled in FIG. 9 includes resistances such as the resistance of a resistor 805, a resistance of the diffusion area between the drain contacts 801 and the poly gate 803, and a resistance between the source contacts 802 and the poly gate 803. As illustrated in FIGS. 8 and 9, the "drain" for the device is connected to the drain contacts 801 via the resistors 805. The resistance values for the ballasting resistances and for parallel resistances are expressed in Equations 6-13.

$$\text{each } R1 \approx R_R + Rcon \qquad \text{Equation 6}$$

$$\text{each } R11 \approx \frac{F}{G+H} * \rho_{diff} \qquad \text{Equation 7}$$

$$\text{each } R12 \approx \frac{B}{2*F} * \rho_{diff} \qquad \text{Equation 8}$$

$$\text{each } R13 \approx \frac{F}{2*B} * \rho_{diff} \qquad \text{Equation 9}$$

$$\text{each } R2 \approx \text{Rcon} \qquad \text{Equation 10}$$

$$\text{each } R21 \approx \frac{F}{G+H} * \rho_{diff} \qquad \text{Equation 11}$$

$$\text{each } R22 \approx \frac{A}{2*F} * \rho_{diff} \qquad \text{Equation 12}$$

$$\text{each } R23 \approx \frac{F}{2*A} * \rho_{diff} \qquad \text{Equation 13}$$

In Equations 6-13, $\rho_{diff}$ is the sheet resistance of the diffusion region 800, $R_R$ is the resistance of a resistor 805, which can be implemented by a poly resistor as indicated in FIG. 8 or can another type of resistor such as a diffusion resistor, and Rcon is a single contact resistance. Usually R1 is much larger than R2, and typically, R1 is typically connected to the pad for providing ESD protection. The values of A, B, C, D, E, F, G, H, L and W can be varied to control the amount of current that the snapback device can safely handle while still taking manufacturing design rules into account. A and B are typically made to be greater than or equal to 1.5 times the minimum contact to gate spacing design rule of the process; L is typically between 1 and 1.2 times the minimum poly gate length for the MOS device; W typically is between 20 μm and 200 μm; E typically is greater than or equal to 2 times the minimum diffusion overlap for a contact; F is the contact to contact spacing, which is usually defined by the spacing of the real resistor 805; H is the contact width, which is usually a value defined by the process; G is typically equal to the minimum diffusion overlap for a contact; C and D set the $R_R$ resistance, which is made such that the resistance value is large enough to spread the current relatively evenly through the device.

The style of ballasting described in connection with FIG. 8 reduces the overall size of the snapback device as compared to the ballasting described earlier in connection with FIG. 7.

SUMMARY OF THE INVENTION

One aspect of the invention is an apparatus including: a semiconductor substrate assembly; a gate disposed on the semiconductor substrate assembly; a first area on a first side of the gate, the first area having both salisided diffusion areas and at least one non-salisided area, wherein there is no polysilicon on the non-salisided areas; a second area on a second side of the gate; and contacts electrically coupled to the salisided diffusion areas, wherein the at least one non-salisided area is disposed between contacts that are spaced apart along a side of the gate.

One aspect of the invention is a method of forming a semiconductor device, where the method includes: providing a semiconductor substrate assembly; forming a patterned mask for excluding saliside diffusion from corresponding portions of the substrate assembly; performing a saliside diffusion process to form a salisided diffusion for a source and a salisided diffusion for a drain, and leaving non-salisided areas corresponding at least to the patterned masks; and forming contacts on the substrate assembly, the contacts including two or more contacts of the same drain or source, wherein the contacts are spaced apart along a side of the gate; wherein the mask is formed such that the non-salisided regions remain between the two or more contacts of the same drain or source.

One aspect of the invention is an apparatus including: a semiconductor substrate assembly; a gate disposed on the semiconductor substrate assembly; gate material extending from a first side of the gate, such that the gate and the gate material are at the same voltage potential; a first area on the first side of the gate, the first area having with diffusion areas and at least one area covered by the gate material extending from the first side of the gate; a second area on a second side of the gate; and contacts electrically coupled to the diffusion areas, wherein the gate material is disposed between contacts that are spaced apart along a side of the gate.

One aspect of the invention is a method of forming a semiconductor device, where the method includes: providing a semiconductor substrate assembly; patterning a polysilicon structure for the semiconductor device such that a first portion forms a gate for the semiconductor device, and such that one or more second portions form a mask for excluding diffusion from corresponding portions of the substrate assembly, wherein the first portion and the one or more second portions have electrical continuity; performing a diffusion process thereby forming at least a diffusion region for a drain and at least a diffusion region for a source, wherein the one or more second portions of the polysilicon structure extend outward from the first portion and over a portion of at least one of the drain or the source; and forming contacts on the substrate assembly, wherein the contacts and the second portions of the polysilicon structure are formed such that second portions are disposed between two or more contacts of the same drain or source region.

One aspect of the invention is an apparatus including: a semiconductor substrate; a gate disposed on the semiconductor substrate; a first area on a first side of the gate, the first area having diffusion areas and areas covered by gate material; a second area on a second side of the gate; contacts for the first area electrically coupled to the salisided diffusion areas, wherein gate material is disposed between contacts that are spaced apart along a side of the gate; one or more contacts electrically coupled to the gate material; and metallization electrically coupling the contacts for the salisided diffusion areas to the one or more contacts for the gate material.

One aspect of the invention is a method of forming a semiconductor device, where the method includes: providing a semiconductor substrate assembly; patterning polysilicon for the semiconductor device to form a gate structure for the semiconductor device, and to form one or more masks for excluding diffusion, wherein the gate structure and the one or more masks are electrically isolated; performing a diffusion process thereby forming at least a diffusion region for a drain and at least a diffusion region for a source, wherein the one or more masks are formed overlying a portion of at least one of a drain or source such that the masked portions are diffusion excluded; and forming contacts on the substrate assembly such that the one or more polysilicon masks are tied to the same potential as the underlying region for a mask.

BRIEF DESCRIPTION OF THE DRAWINGS

These drawings and the associated description herein are provided to illustrate specific embodiments of the invention and are not intended to be limiting.

DETAILED DESCRIPTION OF PREFERRED EMBODIMENTS

Figure 8:
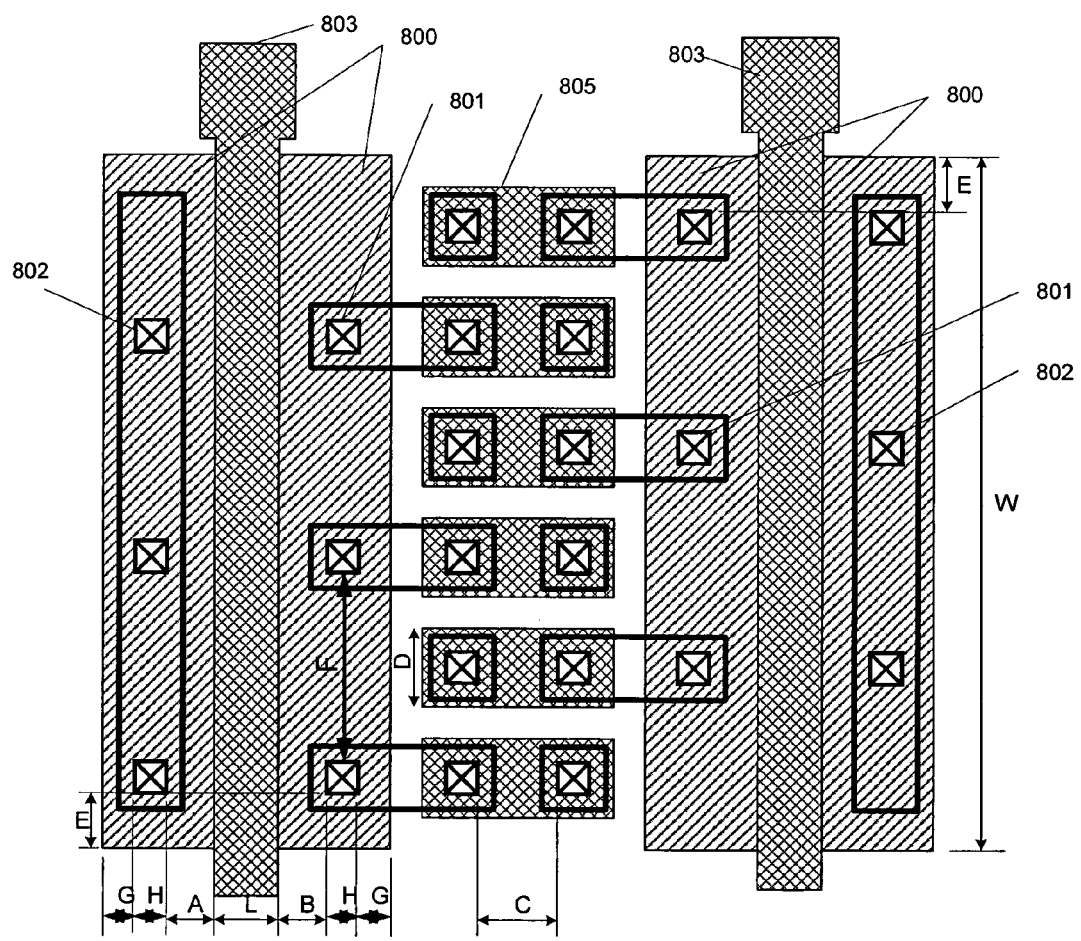
FIG. 8 illustrates a conventional two-finger snapback device with resistors for ballasting resistance for the drain.

Although particular embodiments are described herein, other embodiments of the invention, including embodiments that do not provide all of the benefits and features set forth herein, will be apparent to those of ordinary skill in the art. In addition, while illustrated in FIGS. 10-13 in the context of NMOS, ballasting resistance structures in the proximity of the drain and the gate, and with two-finger implementations, those of ordinary skill in the art will appreciate that the principles and advantages described herein are applicable to both NMOS and PMOS, to ballasting resistance structures in the proximity of the source and the gate, and to single-finger snapback devices or even to snapback devices with more than 2 fingers. In addition, the structures disclosed herein can be used with or without the resistors 805 described earlier in connection with FIG. 8.

A desirable characteristic is to spread the current flow relatively evenly throughout a device. In the context of ballasting in the proximity of the drain and the gate, it is desirable for the values of the parasitic resistances modeled by R11 and R13 to be as high as practical to reduce the current from one contact passing into an area being served by another contact, which could otherwise lead to current crowding into a weak spot, which could then cause damage. It is desirable to use a relatively large number of contacts to allow relatively large overall currents to flow, such as, for example, 2 Amps for ESD and 20 to 100 mA for drivers, while still occupying a relatively small area for cost.

Figure 9:
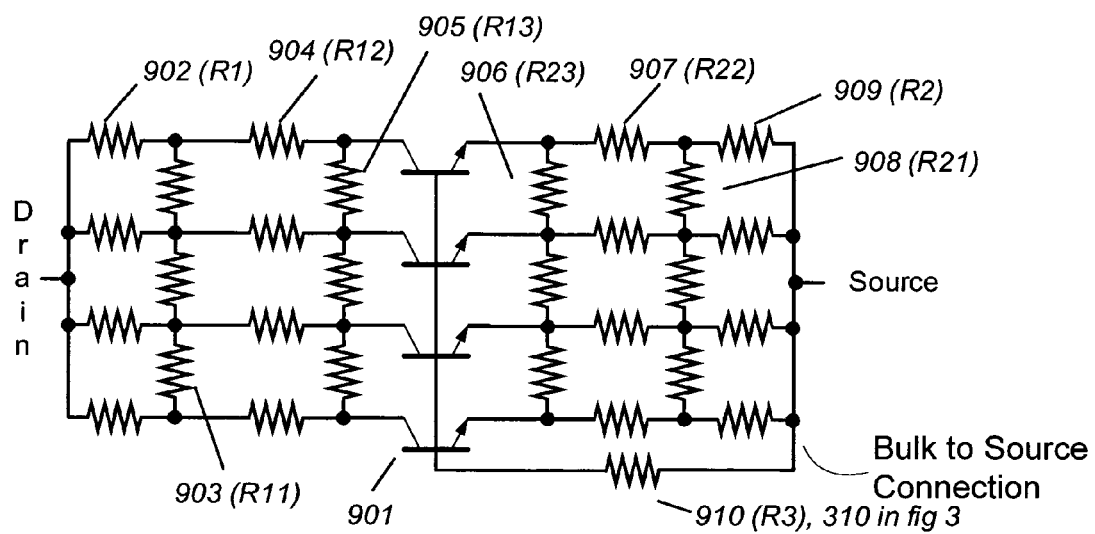
FIG. 9 is a schematic of an equivalent model.

The conventional technique described earlier in connection with FIG. 8 results in an increase in the spacing between contacts ("F" in FIG. 8) to increase the resistances modeled in FIG. 9 as R11 and R13. This makes the device relatively large and expensive to be able to handle the relatively large currents or can limit the amount of current the device can handle in a non-ESD event since the contacts have long-term current limits. Also to be able to make very compact layouts, the type of resistor 805 used rather than optimizing R11 and R13 defines the distance F.

Figure 4:
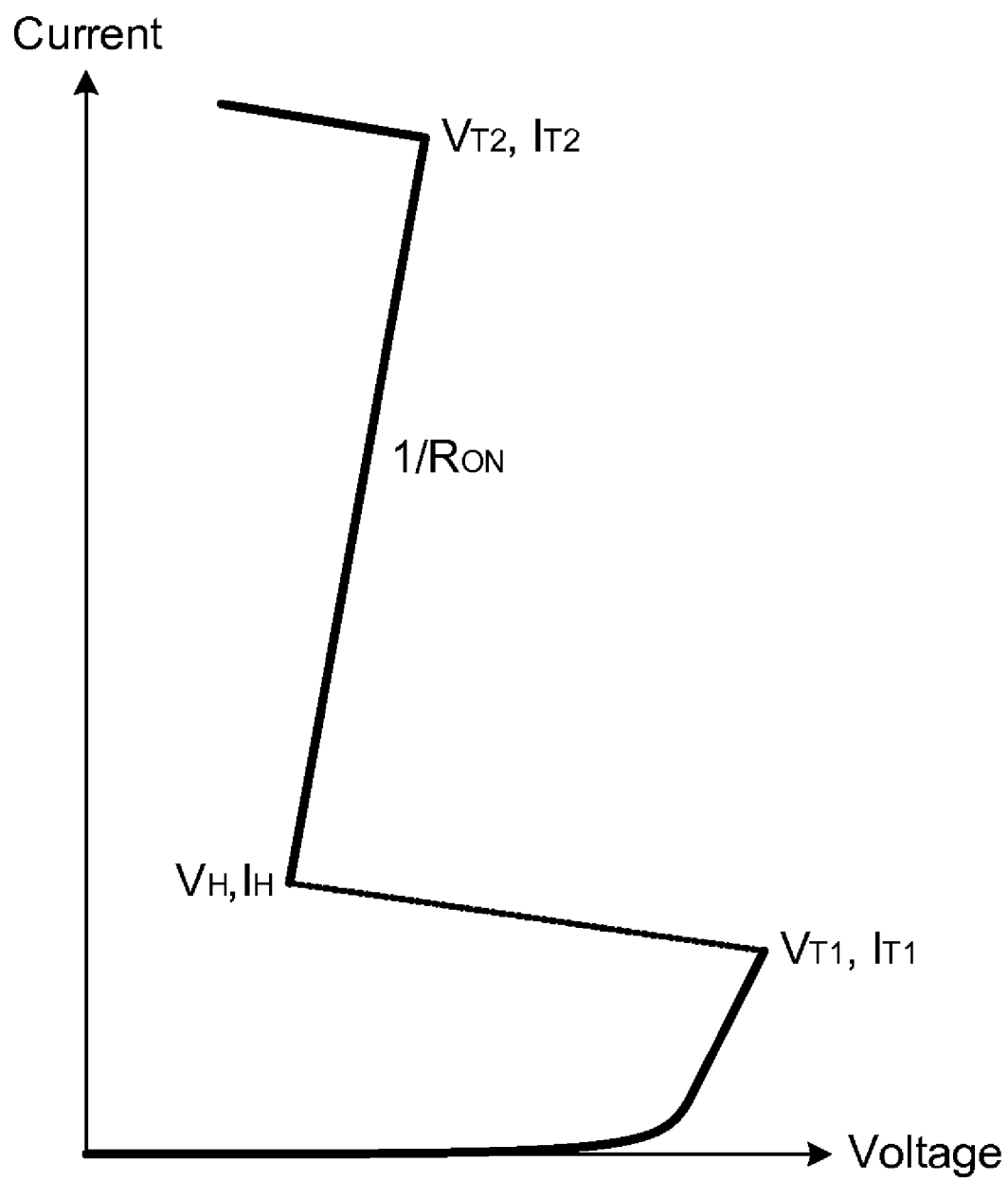
FIG. 4 illustrates an I-V curve for a snapback device.
Figure 5:
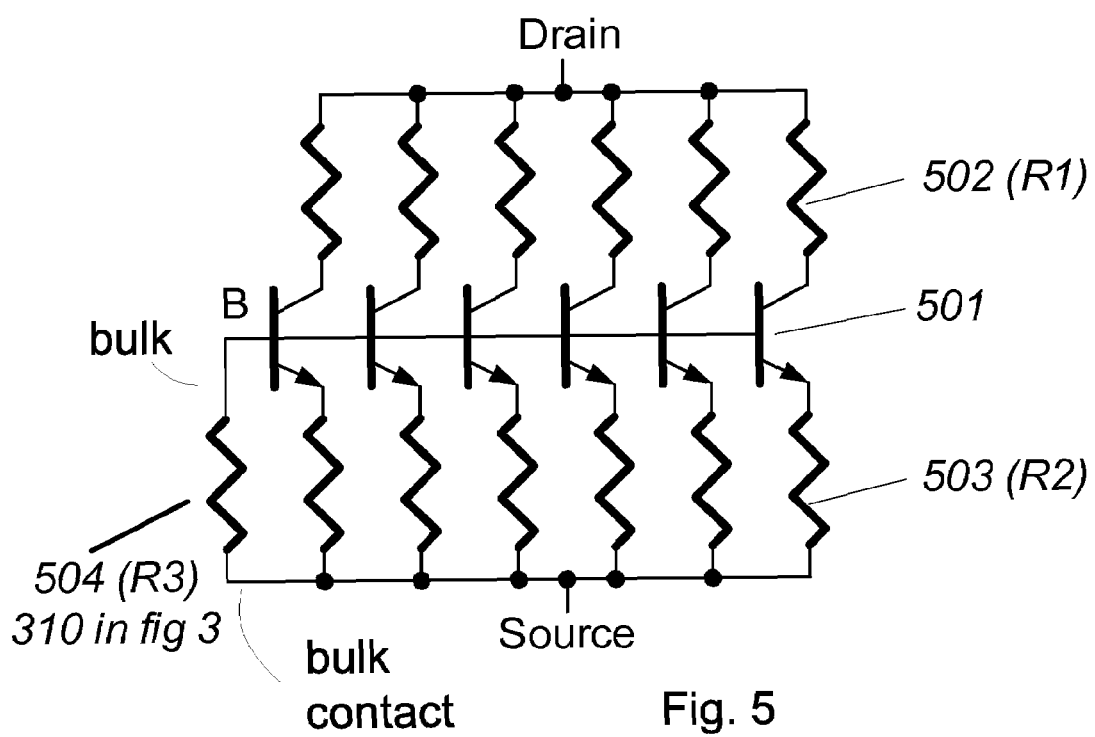
FIG. 5 is a schematic of an equivalent model for variations across a snapback device.
Figure 6:
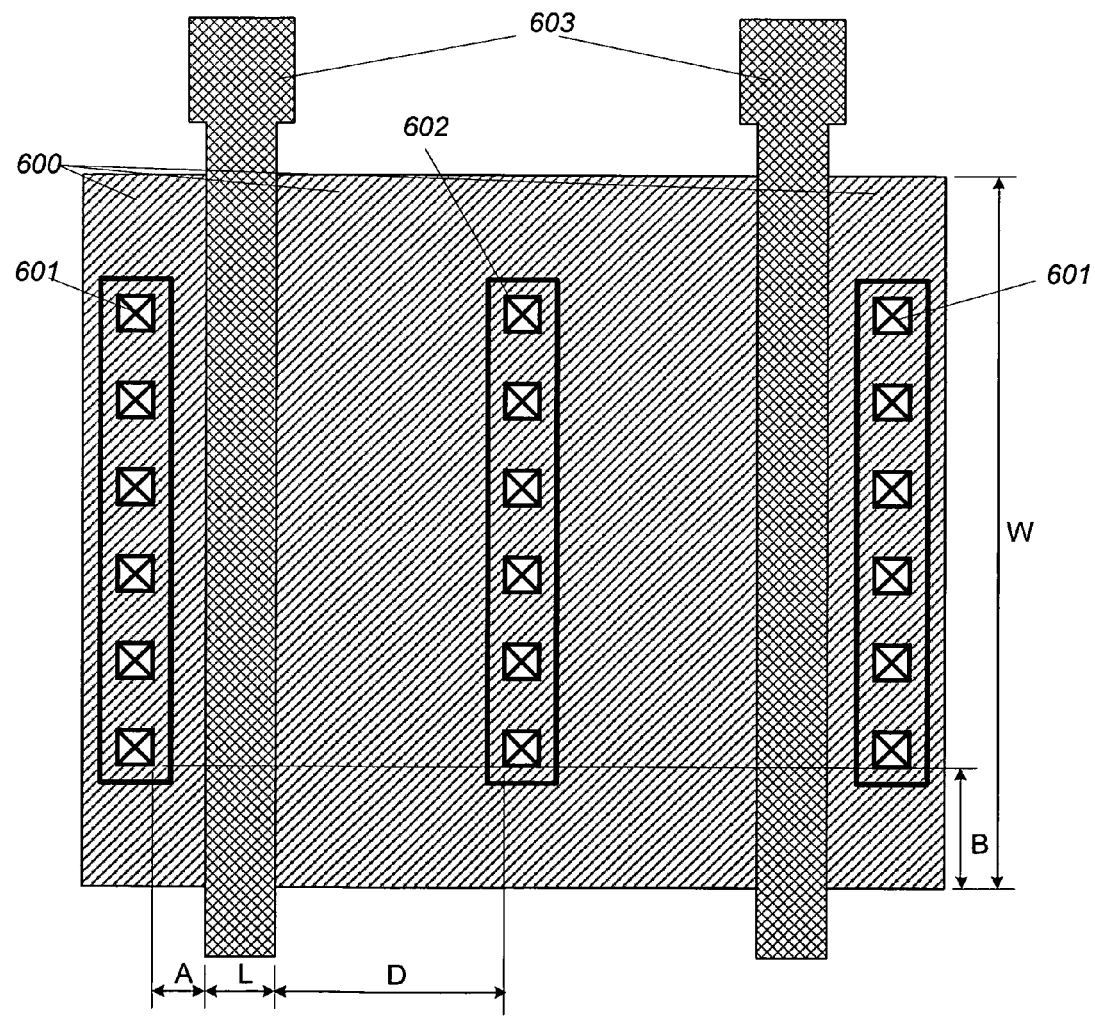
FIG. 6 illustrates a conventional two-finger snapback device using a diffusion area between contacts to implement ballasting resistances.
Figure 7:
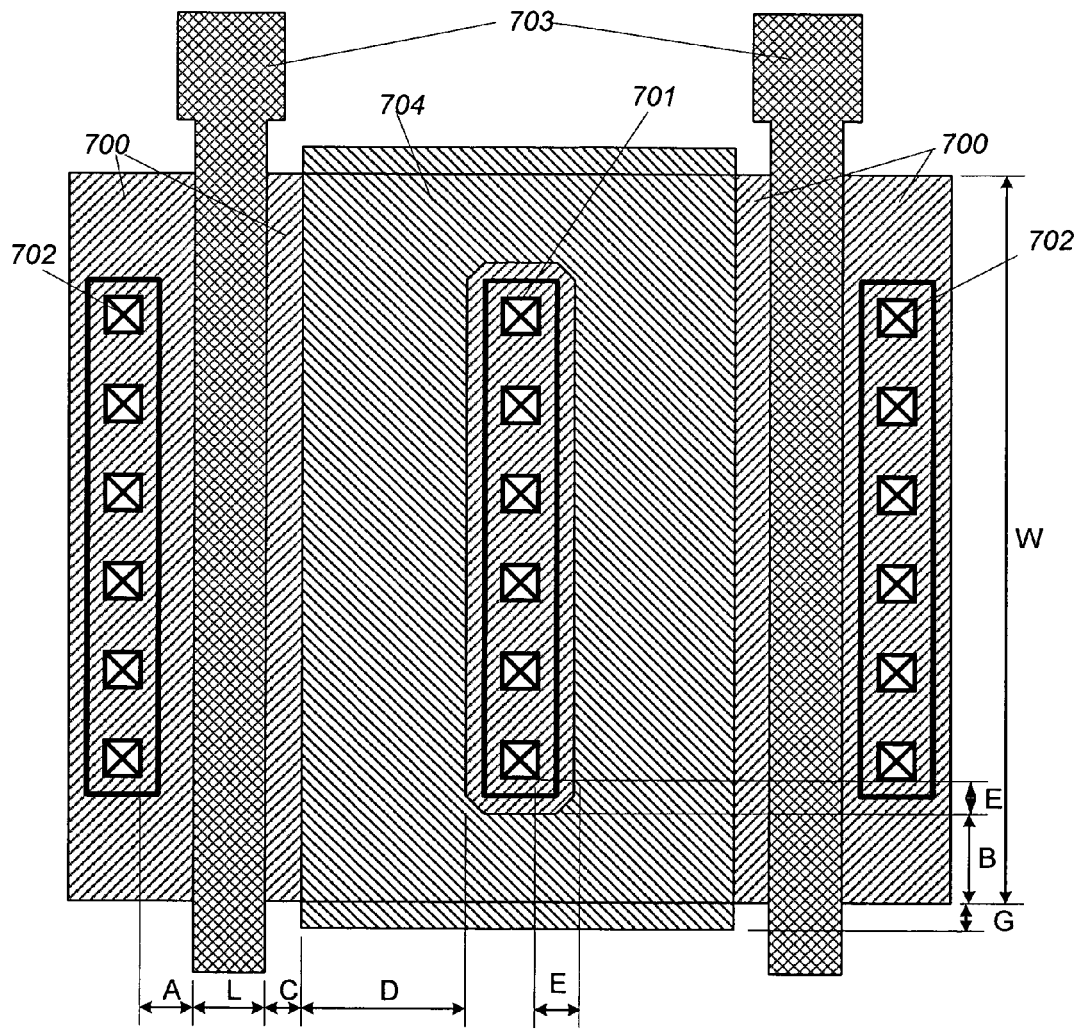
FIG. 7 illustrates a conventional two-finger snapback device with a non-salisided diffusion region between the drain and the gate, and a salisided region between the source and the gate.

As described earlier in connection with FIG. 4, the trigger for snapback is avalanche multiplication of current in the reverse-biased diode (drain to bulk in the NMOS device) to raise the voltage drop across the resistance modeled as R3 910 in FIG. 9. The overall area of the snapback device should be relatively small so that the IR drop across the resistance R3 910 is high enough to turn on all the parasitic NPN transistors rather than just a few fingers (or parts of fingers) of the parasitic NPN transistors.

The embodiments of the invention that will be described in the following provide a high ESD tolerance in a relatively small overall device size. In addition, characteristics for current paths modeled by parasitic resistors R11 and R13 are improved, i.e., relatively higher resistance, while providing for a large number of contacts (for high current capabilities).

Segmented Saliside Ballast

Figure 10:
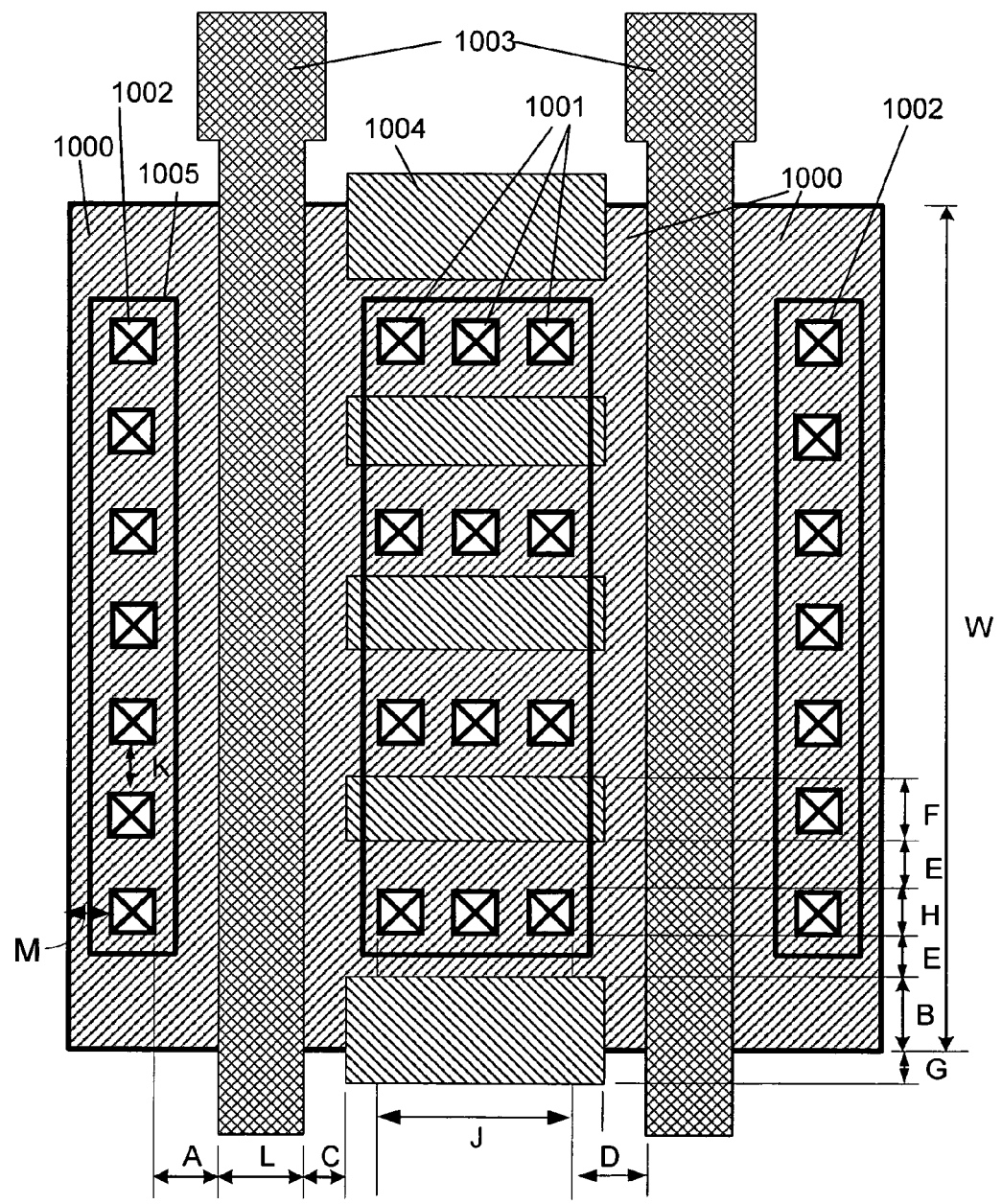
FIG. 10 illustrates an embodiment of a two-finger snapback device with a segmented saliside ballast.

The segmented saliside ballast arrangement illustrated in FIG. 10 can be used with a salisided diffusion process, which is typical of modern CMOS processes. As used herein, saliside (or salisided) includes saliside, silicide, salicide, etc. The segmented saliside ballast layout style substantially increases the resistances modeled by resistors R11 and R13 in FIG. 9 with respect to the arrangement described earlier in connection with FIG. 8.

A two-fingered configuration is shown in FIG. 10. The arrangement can be extended to single-fingered configurations and to configurations with more than two fingers. FIG. 10 illustrates a diffusion region 1000 of a semiconductor substrate, a drain region generally in the center, two gates 1003 with a gate 1003 to the left and a gate 1003 to the right of the drain region, and source regions outside the gates 1003. Drain contacts 1001 provide electrical connection for the drain. Source contacts 1002 provide electrical connection for the source.

A non-salisided diffusion region 1004 between contact rows 1001 provides additional resistance between contact rows 1001. In one embodiment, the non-salisided diffusion regions 1004 are protected from a saliside diffusion by a salisided exclusion mask. In the illustrated embodiment, there is one contact row 1001 for each "segment" of the device. The illustrated configuration typically also permits the removal of the resistor $R_R$ 805 described earlier in connection with FIG. 8, which decreases the overall size and cost of the structure. However, it will be understood that the resistor $R_R$ 805 can still be used if desired. In addition, while a single contact can be used, multiple contacts are typically placed within each segmented region for current handling as illustrated by the multiple drain contacts 1001 in FIG. 10. The use of multiple contacts decreases the resistance R1 as expressed in Equation 14. Too low of a resistance R1 can be undesirable because the sum of resistances R1 and R12 should be high enough to spread the current out among multiple contacts relatively evenly. Rectangular boxes above the contacts indicate conductive metal for the contacts.

To handle current relatively evenly, the number of contacts for the source side should be about equal to or relatively close to the number of contacts for the drain side. However, the total number of drain contacts 1001 and the total number of source contacts 1002 can vary as long as each side has enough contacts for current handling. This can be done by either having multiple columns of contacts in the source side, by placing contacts on opposite sides of the non-salisided diffusion regions 1004, by using both multiple columns and opposing contacts, and the like. Equations 14-22 express resistance values for the ballasting resistances and for the parallel resistances as modeled in FIG. 9.

$$\text{each } R1 \approx \frac{Rcon}{\#ofContacts} \quad \text{Equation 14}$$

$$\text{each } R11 \approx \frac{2*E}{J}*\rho_{diff} + \frac{F}{J}*\rho_{ex-diff} \quad \text{Equation 15}$$

$$\text{each } R12 \approx \frac{D}{2*E+H}*\rho_{diff} \quad \text{Equation 16}$$

$$C > 0; \text{ each } R13 \approx \frac{2*E+F}{C}*\rho_{diff} \quad \text{Equation 17}$$

$$C \leq 0; \text{ each } R13 \approx \frac{2*E}{D}*\rho_{diff} + \frac{F}{D}*\rho_{ex-diff} \quad \text{Equation 18}$$

$$\text{each } R2 \approx Rcon \quad \text{Equation 19}$$

$$\text{each } R21 \approx \frac{K}{M+H}*\rho_{diff} \quad \text{Equation 20}$$

$$\text{each } R22 \approx \frac{A}{2*K}*\rho_{diff} \quad \text{Equation 21}$$

$$\text{each } R23 \approx \frac{K}{2*A}*\rho_{diff} \quad \text{Equation 22}$$

In Equations 14-22, $\rho_{diff}$ is the sheet resistance of the diffusion region 1000, $\rho_{ex-diff}$ is the sheet resistance of the non-salisided diffusion region 1004, #ofContacts is the number of drain contacts 1001 between non-salisided blocking regions 1004, and Rcon is a single contact resistance. R1, i.e., all of the drain contacts 1001, can be connected to the pad for providing ESD protection. The values of A, B, C, D, E, F, G, H, J, K, L, M and W can be varied to control the amount of current that the snapback device can safely handle while still taking manufacturing design rules into account. It should be noted that some of the variable letters used for referencing dimensions are reused in other figures and correspond to other dimensions.

Examples of ranges for these values are provided in the following. Other values will be readily determined by one of ordinary skill in the art. In one embodiment: A and D are typically made to be greater than or equal to 1.5 times the minimum contact to gate spacing design rule of the process; L is typically between 1 and 1.2 times the minimum poly gate length for the MOS device; W typically is between 5 μm and 60 μm; M typically is the minimum diffusion overlap for a contact; G+B and F are typically greater than or equal to the minimum width of the salisided diffusion exclusion region; H is the contact width, which is usually a single value defined by the process; C is typically the minimum design rule for the distance between poly and the salisided exclusion layer, and in some processes, C can be negative or zero, such that the salisided exclusion mask can overlap or touches the poly, and hence, Equation 17 would simplify to Equation 18; K is typically the minimum contact to contact spacing; G is typically the minimum overlap of salisided exclusion layer over diffusion; and J is the width of the contacts 1001 in the drain and made such that the resistance value of R1+R11 is large enough to spread the current relatively evenly through the device. A relatively large value for R11 helps to balance current across the width of a finger. A relatively large value for R12 helps to balance current across the width of a finger and among multiple fingers.

It will be appreciated that many variations are possible. For example, the dimensions referenced with "E" do not have to be symmetric, e.g., the dimensions could be E1 and E2. In another example, the width of and/or the number of contacts 1001 for the drain region can vary among fingers.

Gate Material Segmented Ballasting Type I

Figure 11:
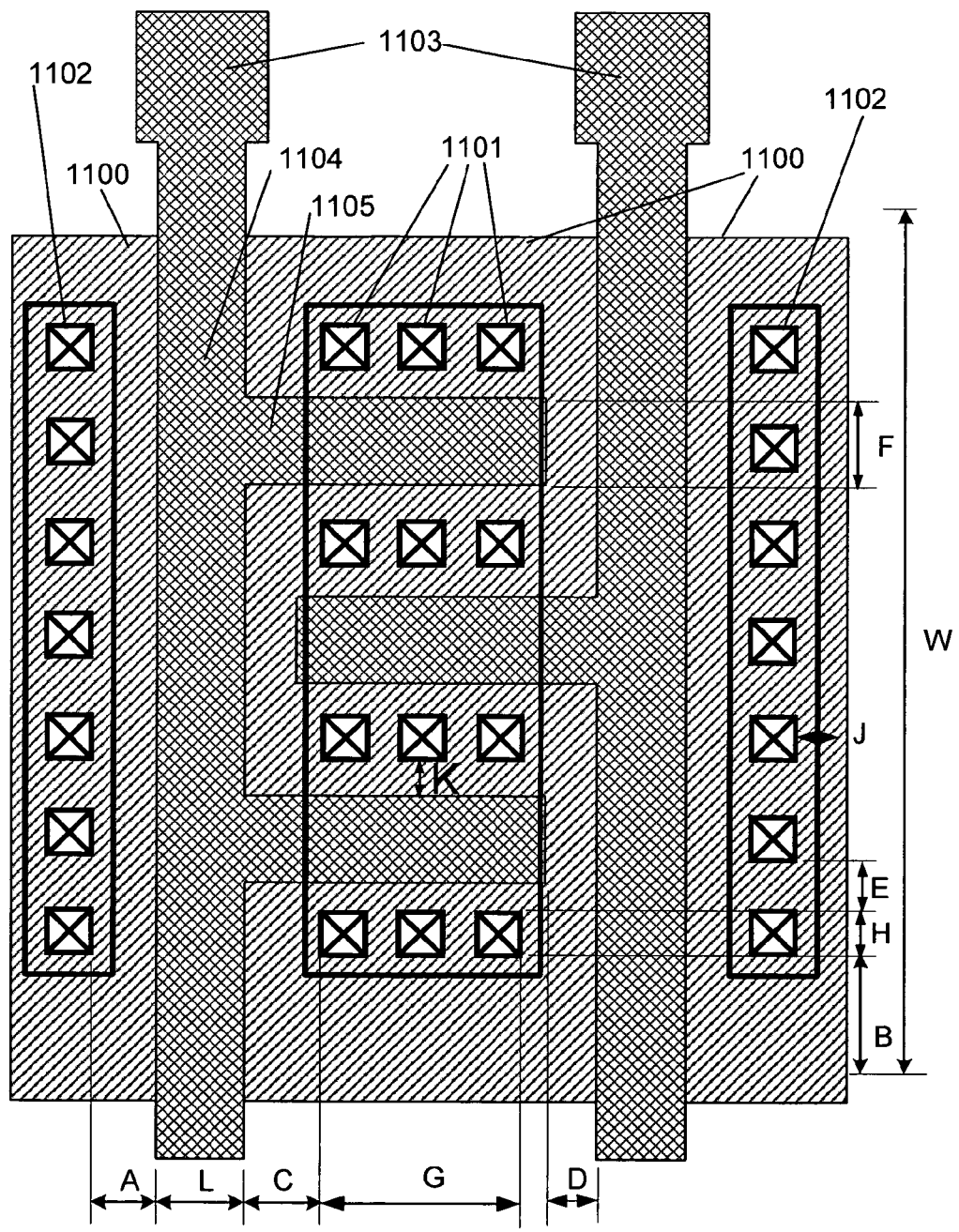
FIG. 11 illustrates an embodiment of a two-finger snapback device with a first type of gate material-segmented ballast.
Figure 12:
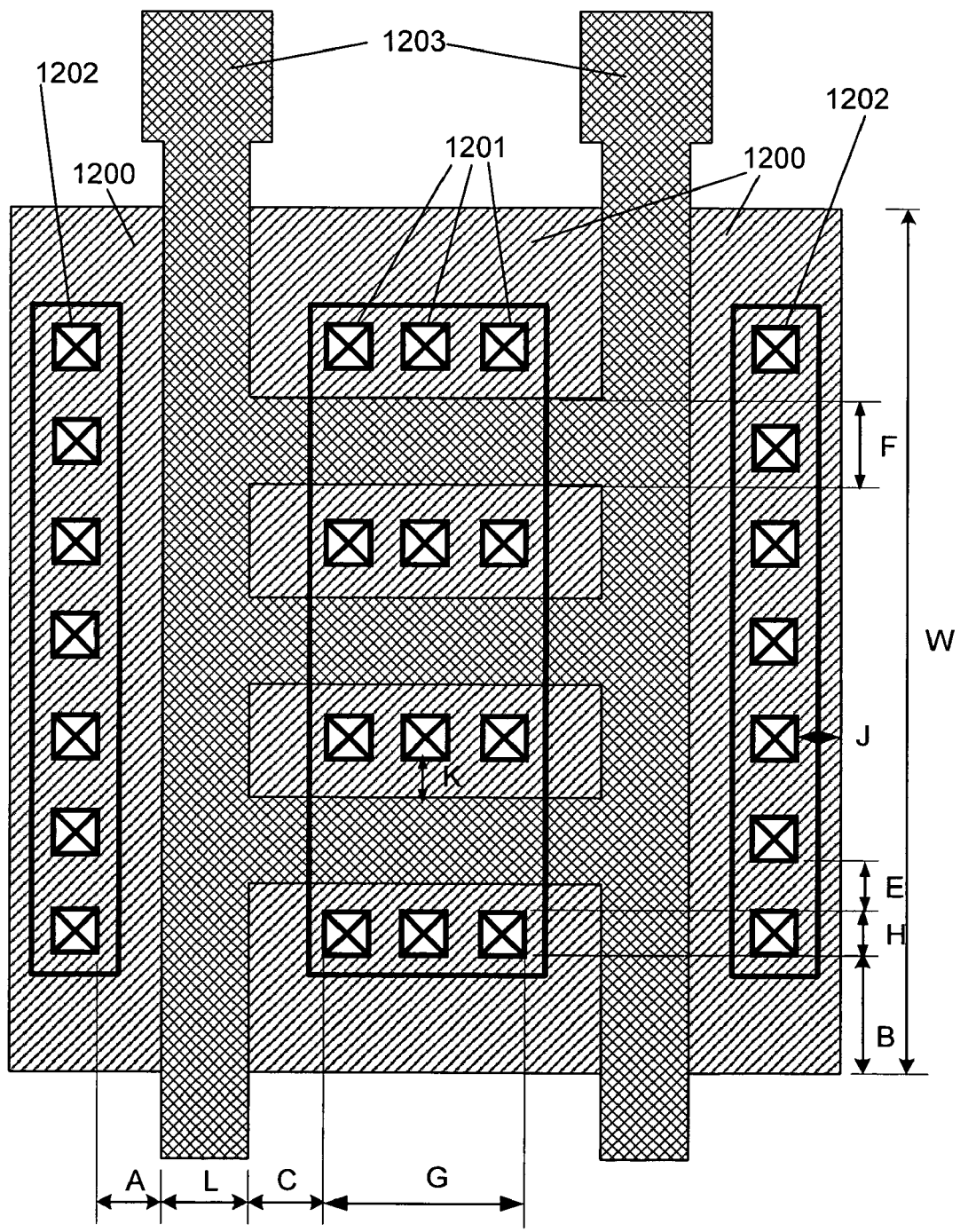
FIG. 12 illustrates an embodiment of a two-finger snapback device with the first type of gate material-segmented ballast, with a dimension for a gap D set to zero.
Figure 13:
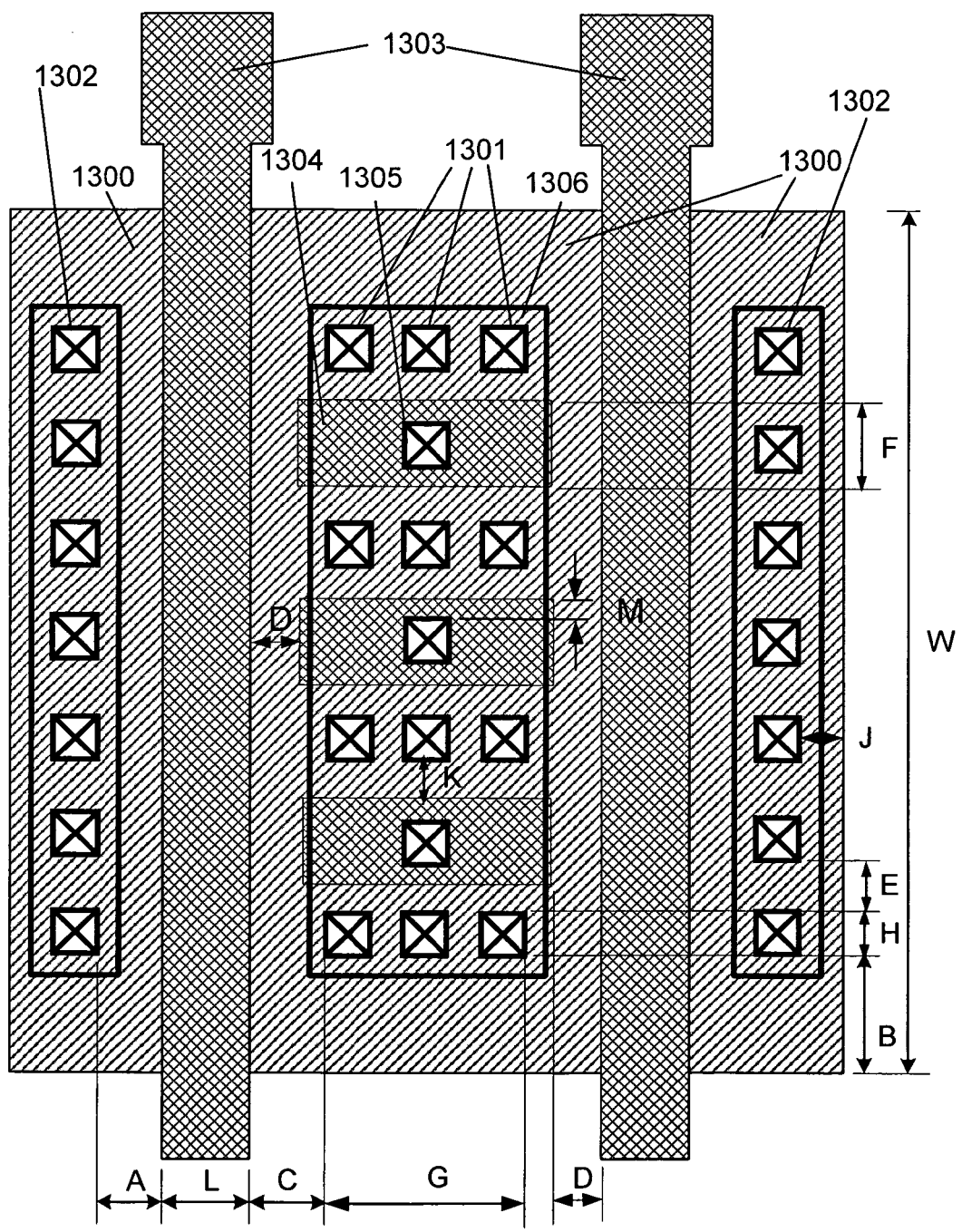
FIG. 13 illustrates an embodiment of a two-finger snapback device with a second type of gate material-segmented ballast.

FIGS. 11, 12, and 13 illustrate segmented ballasting techniques using gate material as a mask to prevent source or drain diffusion, which thereby generates the segmented ballasting. The gate material or materials selected should prevent diffusion during fabrication. In one embodiment, the gate material or materials also prevent salisided diffusion during fabrication. In the illustrated embodiments of FIGS. 11, 12, and 13, the gate material is polysilicon or "poly," and will be described in that context. In the embodiments illustrated in FIGS. 11 and 12, the gate material is extended from the gate to create masks that increase the resistances modeled as R11 and R13 in FIG. 9. In the "Type I" embodiments illustrated in FIGS. 11 and 12, the poly 1103, 1203 for the gate and for the mask are connected to the gate potential. In the "Type II" embodiment that will be described later in connection with FIG. 13, poly for masks 1304 is formed between contact rows to increase the resistances modeled as R11 and R13 in FIG. 9. The poly for the mask 1304 is not connected to the same potential as the poly for the gate 1303.

Returning now to the "Type I" embodiments, the Gate Material Segmented Ballasting arrangement illustrated in FIG. 11 uses a configuration of polysilicon or poly 1103 to increase the resistances modeled as R11 and R13 in FIG. 9 relative to the conventional configuration described earlier in connection with FIG. 8. FIG. 11 illustrates a two-finger configuration with a diffusion region 1100 of a semiconductor substrate, a drain region generally in the center, two gates formed from the poly 1103 to the left and to the right of the drain region, and source regions outside the gates. Drain contacts 1101 provide electrical connection for the drain. Source contacts 1102 provide electrical connection for the source.

In one embodiment, the poly 1103 is laid down, such as via a patterning process, then the source/drain diffusion is performed, then the salicide diffusion is performed, and the poly 1103 masks the underlying regions from becoming salicided, and then an oxide layer for the gate oxide is grown through the poly 1103. It will be understood by the skilled practitioner that the order of steps in the fabrication of MOS transistor and the selection of materials can be varied in many ways. For example, a gate oxide layer can be formed first, and then the polysilicon gate can be patterned over the oxide later. In another example, a silicon oxynitride layer is used instead of silicon oxide for a gate oxide. It will also be understood that other materials that prevent salicide diffusion can be used instead of polysilicon.

The poly 1103 includes a first portion 1104 between source and drain regions functioning as a gate, and in the illustrated embodiment, a second portion 1105 extending from the first portion into the drain region, which functions as a mask for the salicide diffusion. The portions of the semiconductor substrate masked by the poly 1103 do not become salicided, and accordingly exhibit relatively higher resistivity than salicided regions. This increases the resistances of FIG. 9 modeled as R11 and R13.

As illustrated in FIG. 11, the poly 1103 is extended between rows of drain contacts 1101. Accordingly, the process for forming the poly 1103 should be compatible with 90° bends in a diffusion region or active area. In the illustrated embodiment, the resistor $R_R$ 805 structures described earlier in connection with FIG. 8 are not used to decrease the size and cost of the overall structure. However, the resistor $R_R$ 805 structures can also be used if desired. In general, while a single contact can be used, multiple contacts are typically placed within each segmented gate region to allow for higher current handling. The use of multiple contacts decreases the resistance R1 as expressed in Equation 23. The sum of resistances R1 and R12 described earlier in connection with FIG. 9 should remain high enough to spread the current out among the multiple contacts relatively evenly.

To handle current relatively evenly, the number of contacts for the source side should be about equal to or relatively close to the number of contacts for the drain side. However, the total number of drain contacts 1101 and the total number of source contacts 1102 can vary as long as each side has enough contacts for current handling. For example, multiple source contacts 1102 can be provided increased by either having multiple columns of contacts in the source side, by placing contacts opposite to the gate regions, by using both multiple contacts and contacts on opposite sides, and the like. Rectangular boxes above the contacts indicate conductive metal for the contacts.

FIG. 12 illustrates an embodiment that is a variation of the embodiment described in connection with FIG. 11. It is possible to "close" the poly, i.e., set D=0, as illustrated in FIG. 12, but this is often not done due to the size of minimum poly hole allowed by the process rules. FIG. 12 illustrates a two-finger configuration with a diffusion region 1200 of a semiconductor substrate, a drain region generally in the center, a gate 1203 to the left and to the right of the drain region with left and right portions connected via the poly, and source regions outside the gates 1203. Drain contacts 1201 provide electrical connection for the drain. Source contacts 1202 provide electrical connection for the source.

Equations 23-31 express resistance values for the ballasting resistances and for the parallel resistances as modeled in FIG. 9 for both the embodiments of FIGS. 11 and 12.

$$\text{each } R1 \approx \frac{Rcon}{\#ofContacts} \quad \text{Equation 23}$$

$$\text{each } R11 \approx \frac{2*K}{G}*\rho_{diff} + \frac{F}{G}*\rho_{gate-diff} \quad \text{Equation 24}$$

$$\text{each } R12 \approx \frac{C}{2*K+H}*\rho_{diff} \quad \text{Equation 25}$$

$$D>0; \text{ each } R13 \approx \frac{2*K+F}{C}*\rho_{diff} \, \| \quad \text{Equation 26}$$
$$\left(\frac{2*K}{C}*\rho_{diff} + \frac{F}{C}*\rho_{gate-diff}\right)$$

$$D=0; \text{ each } R13 \approx 2*\left(\frac{2*K}{C}*\rho_{diff}\frac{F}{C}*\rho_{gate-diff}\right) \quad \text{Equation 27}$$

$$\text{each } R2 \approx Rcon \quad \text{Equation 28}$$

$$\text{each } R21 \approx \frac{E}{J+H}*\rho_{diff} \quad \text{Equation 29}$$

$$\text{each } R22 \approx \frac{A}{2*E}*\rho_{diff} \quad \text{Equation 30}$$

$$\text{each } R23 \approx \frac{E}{2*A}*\rho_{diff} \quad \text{Equation 31}$$

In Equations 23-31, $\rho_{diff}$ is the sheet resistance of the diffusion region 1100, $\rho_{gate-diff}$ is the sheet resistance of the diffusion region under the gate, #ofContacts is the number of drain contacts between gate blocking regions, and Rcon is a single contact resistance. R1 is typically connected to the pad for providing ESD protection. Typical ranges for the sheet resistance $\rho_{gate-diff}$ are about 250 to about 1500 ohms/square.

The values of A, B, C, D, E, F, G, H, J, K, L and W can be varied to control the amount of current that the snapback device can safely handle while still taking manufacturing design rules into account. Example ranges for these values will be described in the following. Other values will be readily determined by one of ordinary skill in the art. In one embodiment: A and C are typically made to be about 1.5 times the minimum contact to gate spacing design rule of the process; B is typically greater than or equal to 2 times the minimum diffusion overlap of contact; E is typically the minimum contact to contact spacing allowed; L and F are typically between 1 and 1.2 times the minimum poly gate length for the MOS device; W typically is between 5 μm and 60 μm; K is typically the minimum contact to gate spacing; J is typically the minimum diffusion overlap of contact; H is the contact width, and is usually a single value defined by the process; D can be the minimum design rule for the distance between poly and can be zero, and if zero, then Equation 26 changes to Equation 27; and G is the width of the contacts in the drain and made such that the resistance value R1+R11 is large enough to spread the current relatively evenly through the device.

Gate Material Segmented Ballasting Type II

The Gate Material Segmented Ballasting arrangement illustrated in FIG. 13 uses gate material, such as poly, for masks 1304 between rows of drain contacts 1301 as a mask against source/drain diffusion, but does not electrically couple the poly for the masks 1304 to the voltage potential of the gates 1303. In one embodiment, the gate material also masks saliside diffusion.

FIG. 13 illustrates a two-finger configuration with a diffusion region 1300 of a semiconductor substrate, a drain region generally in the center, two gates 1303 to the left and to the right of the drain region, and source regions outside the gates 1303. Drain contacts 1301 provide electrical connection for the drain. Source contacts 1302 provide electrical connection for the source.

In the illustrated embodiment, the poly regions 1304 segment the drain regions of the underlying transistor. The poly regions 1304 mask the underlying regions to prevent source/drain diffusion and saliside diffusion, which keeps the resistivity of the underlying semiconductor material relatively high. The fabrication of such poly regions 1304 between contacts to separate the contact rows breaks an old process rule "can only contact gate poly on field oxide," which is no longer necessary to follow given modern polyside or saliside processes. The illustrated configuration typically also permits the removal of the resistor $R_R$ 805 described earlier in connection with FIG. 8, which decreases the overall size and cost of the structure. However, it will be understood that the resistor $R_R$ 805 can still be used if desired.

In addition, while a single contact can be used, multiple contacts are typically placed within each gate separated region for greater current handling. The use of multiple contacts decreases the resistance R1 as expressed in Equation 32. The sum of resistances R1 and R12 should be high enough to spread the current out among multiple contacts relatively evenly.

To handle current relatively evenly, the number of contacts for the source side should be about equal to or relatively close to the number of contacts in the drain side. However, the total number of drain contacts 1301 and the total number of source contacts 1302 do not have to be the same. Multiple contacts for the source contacts 1302 can be provided by, for example, having multiple columns of contacts in the source side, by placing contacts opposite to the gate regions, by both of the foregoing, and the like.

Equations 32-39 express resistance values for the ballasting resistances and for the parallel resistances as modeled in FIG. 9 for the embodiment illustrated in FIG. 13.

$$\text{each } R1 \approx \frac{Rcon}{\#ofContacts} \quad \text{Equation 32}$$

$$\text{each } R11 \approx \frac{2*K}{G}*\rho_{diff} + \frac{F}{G}*\rho_{gate-diff} \quad \text{Equation 33}$$

$$\text{each } R12 \approx \frac{C}{2*K+H}*\rho_{diff} \quad \text{Equation 34}$$

$$\text{each } R13 \approx \frac{2*(2*K+F)}{C}*\rho_{diff} \quad \text{Equation 35}$$

$$\text{each } R2 \approx Rcon \quad \text{Equation 36}$$

$$\text{each } R21 \approx \frac{E}{J+H}*\rho_{diff} \quad \text{Equation 37}$$

$$\text{each } R22 \approx \frac{A}{2*E}*\rho_{diff} \quad \text{Equation 38}$$

$$\text{each } R23 \approx \frac{E}{2*A}*\rho_{diff} \quad \text{Equation 39}$$

In Equations 32-39, $\rho_{diff}$ is the sheet resistance of the diffusion region 1300, ρgate-diff is the sheet resistance of the diffusion region under the gate, #ofContacts is the number of drain contacts between gate blocking regions, and Rcon is a single contact resistance. R1 is typically connected to the pad for providing ESD protection.

The values of A, B, C, D, E, F, G, H, J, K, L, M and W can be varied to control the amount of current that the snapback device can safely handle while still taking manufacturing design rules into account. It should be noted that some of the variable letters used for referencing dimensions are reused in other figures and correspond to other dimensions. Example values are provided in the following. Other applicable values will be readily determined by those of ordinary skill in the art. In one embodiment: A and C are typically made to be greater than or equal to 1.5 times the minimum contact to gate spacing design rule of the process; B is typically greater than or equal to 2 times the minimum diffusion overlap for a contact; E is typically the minimum contact to contact spacing allowed; L is typically between 1 and 1.2 times the minimum poly gate length for the MOS device; W typically is between 5 μm and 60 μm; K is typically the minimum contact to gate spacing; J is typically the minimum diffusion overlap of contact; H is the contact width, which is usually a single value defined by the process; M is typically the minimum poly overlap of contact; F is typically twice the sum of M and H; G is the width of the contacts in the drain and made such that the resistance value R1+R11 is large enough to spread the current relatively evenly through the device; and D is typically the minimum design rule for the distance between poly.

The poly 1304 should be connected, i.e., not floating, as otherwise the poly 1304 could potentially charge up and create a channel underneath the poly 1304 that would undesirably reduce R11. As illustrated in FIG. 13, in the illustrated embodiment, the poly 1304 is connected to the drain via a poly contact 1305 and metallization 1306. Even if the contact 1305 is "punched through" the poly 1304, or if the poly 1304 is shorted to the diffusion regions 1306 on either side, the poly 1306 is not the gate of a MOSFET device and the device should be operable.

Other Embodiments

Many variations exist. For example, the embodiments described in connection with FIGS. 10, 11, 12, and 13 illustrate examples of devices with a drain region in the middle, gate regions on opposing sides, and two source regions outside the gates, i.e., a finger to the left and a finger to the right.

Figure 14A:
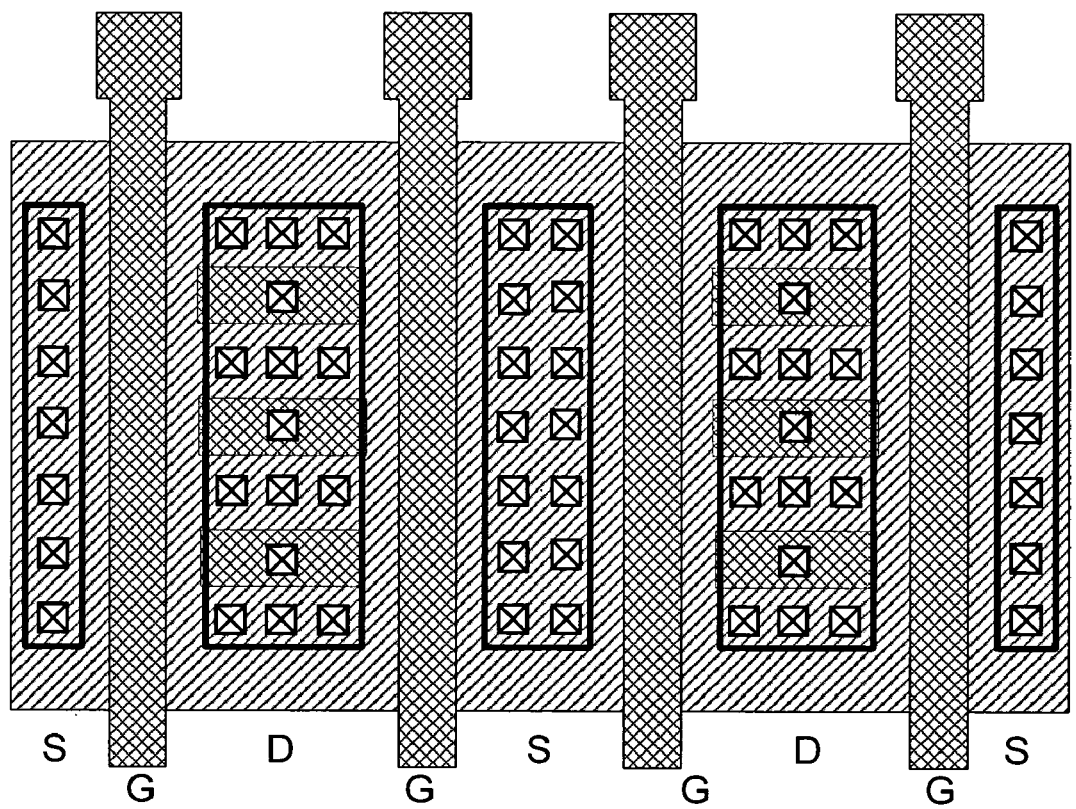
FIG. 14A illustrates an embodiment of a snapback device with the second type of gate material segmented ballast for a MOS transistor with multiple fingers arranged side by side.

For example, FIG. 14A illustrates an example of a snapback device with the second type of gate material segmented ballast for a MOS transistor described earlier in connection with FIG. 13. In the illustrated configuration of FIG. 14A, the snapback device has four fingers arranged side by side. The techniques disclosed herein can be applied to a broad number of fingers.

Figure 14B:
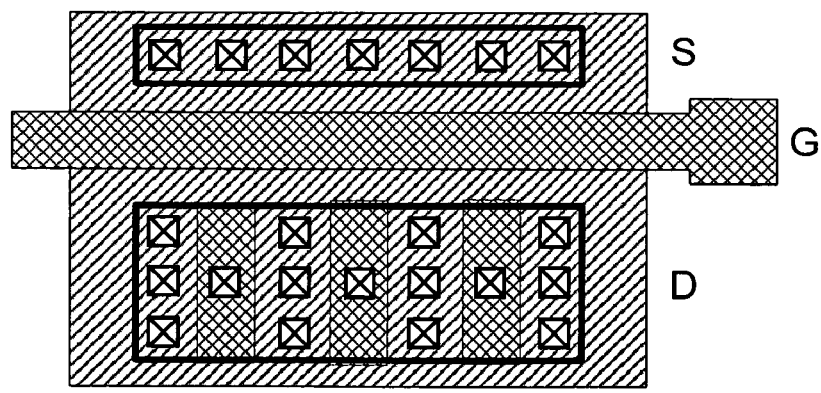
FIG. 14B illustrates an embodiment of a snapback device with the second type of gate material segmented ballast for a MOS transistor with a single finger.

FIG. 14B also illustrates an example of a snapback device with the second type of gate material segmented ballast for a MOS transistor described earlier in connection with FIG. 13. In the illustrated configuration of FIG. 14B, the snapback device has a single finger.

In another example, while the embodiments described earlier in connection with FIGS. 10-13 were described in the context of ballasting on the drain side, the described techniques can also be used on the source side in addition to or instead of on the drain side. In addition, while illustrated between single rows of contacts, the ballasting techniques can be used for groups of more than one row or more than one column of contacts within a segmented area. The described techniques are applicable to both N type and to P type of MOS devices.

Figure 1:
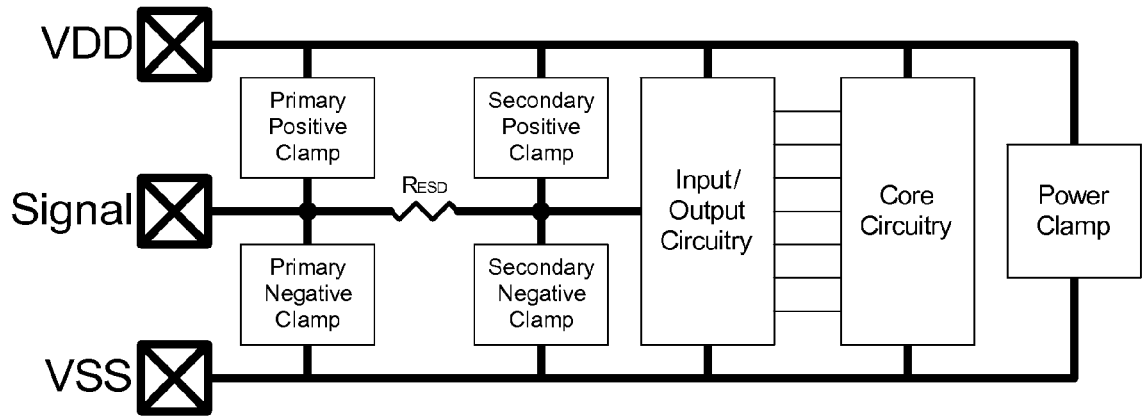
FIG. 1 is a schematic diagram illustrating a representative electrostatic discharge (ESD) protection strategy.
Figure 2:
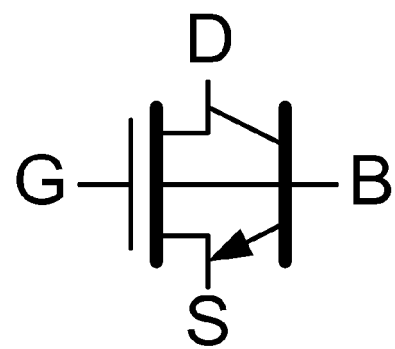
FIG. 2 illustrates a parasitic NPN bipolar transistor for an NMOS device.
Figure 3A:
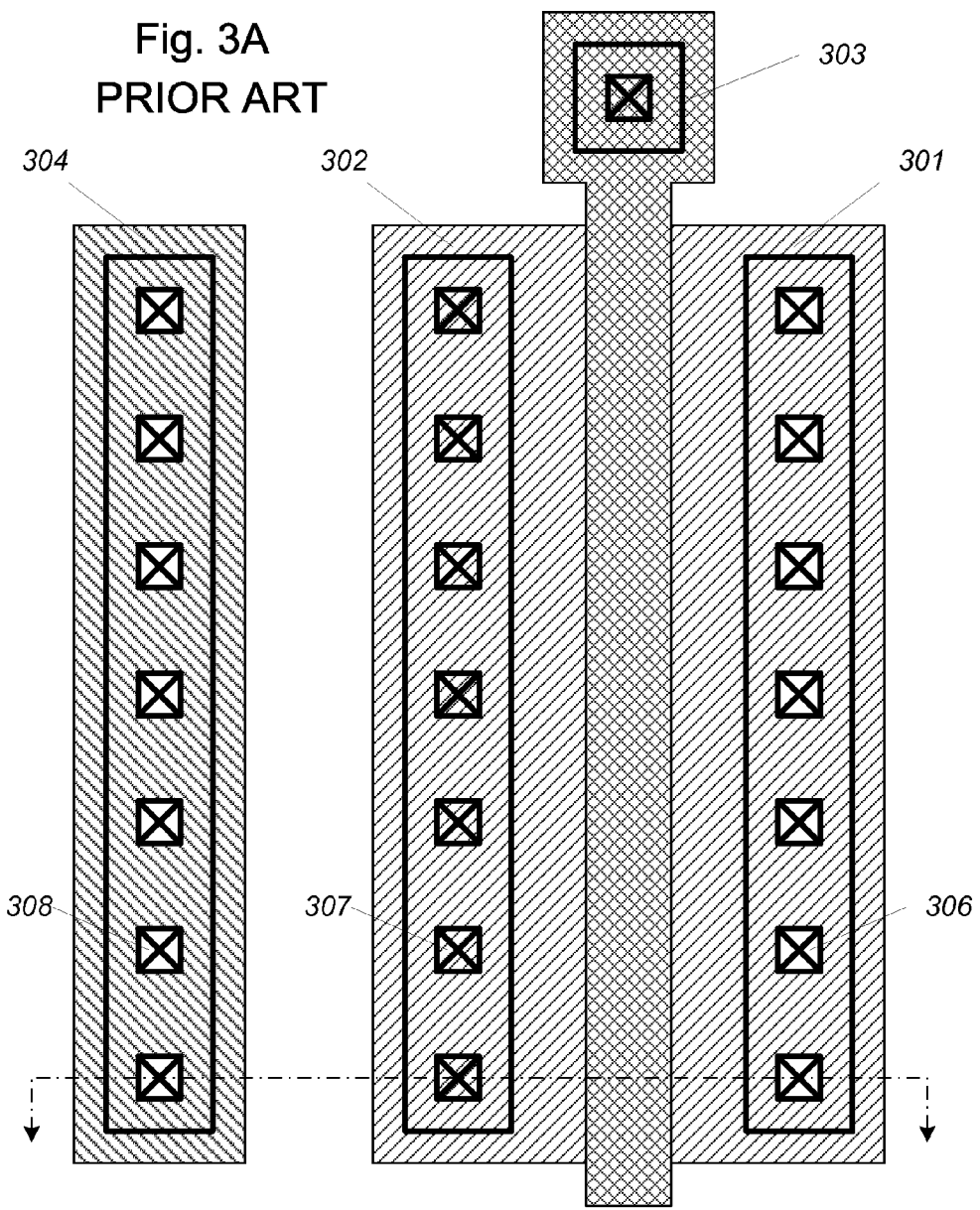
FIGS. 3A and 3B illustrate a layout (top view) and cross sectional view of a single-finger snapback device in a P-type substrate CMOS technology with Shallow Trench Isolation (STI).
Figure 3B:
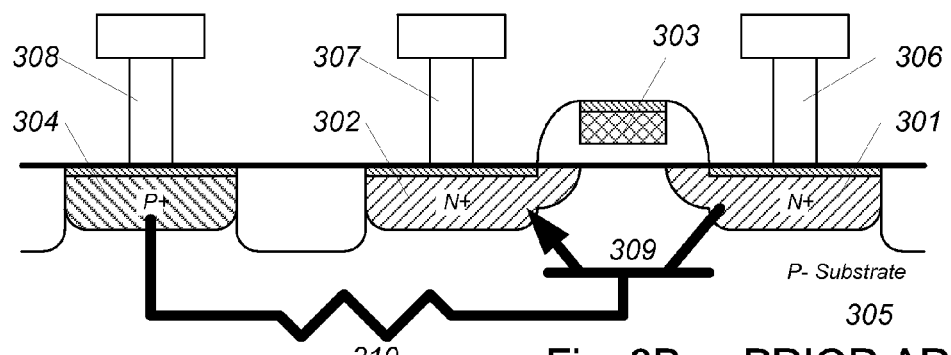

These techniques can be applied at any inputs, outputs, or power supplies terminals of a CMOS Integrated Circuit (IC). For example, these techniques can be used to connect to a CMOS die to a printed circuit board (PCB), such as via a package or direct bonding of the die to the PCB. These techniques can be use to connect a CMOS die to another integrated circuit (IC), such as within a package. Examples include system in package (SIP), die-on-die stacking in chip scale packaging (CSP), and the like, or directly bonding of the CMOS die to another die, and the like. In one example, the snapback devices are combined with diodes to provide ESD protection in a first direction with the diodes, and in a second direction with the snapback devices. For example, with reference to FIG. 1 and the block to the right labeled "power clamp," a diode can be used to protect the circuits from a negative voltage transient that generates current in the direction from VSS to VDD, and a snapback device can be used to protect the circuits from a positive voltage transient that generates current in the direction from VDD to VSS. These techniques can also be applied in any of the blocks labeled as "primary positive clamp," "secondary positive clamp," "primary negative clamp," or "secondary negative clamp."

Output Current Balancing

The described techniques are also useful for the balancing of current passing through a MOS transistor (NMOS or PMOS) as opposed to the parasitic bipolar transistor that is inherent to a MOS transistor. For example, the described techniques are also useful to balance current for output or driver stages, which can have relatively high output currents. The techniques can also be used where ballasting of output stages, which may or may not go off-chip, is useful. For example, it can be useful to balance the current in a relatively high-current output stage. These high current output stages can, but do not necessarily go off-chip, so that the output stages may or may not be subjected to ESD. However, the current balancing techniques are still applicable.

Fabrication Processes

Figure 15:
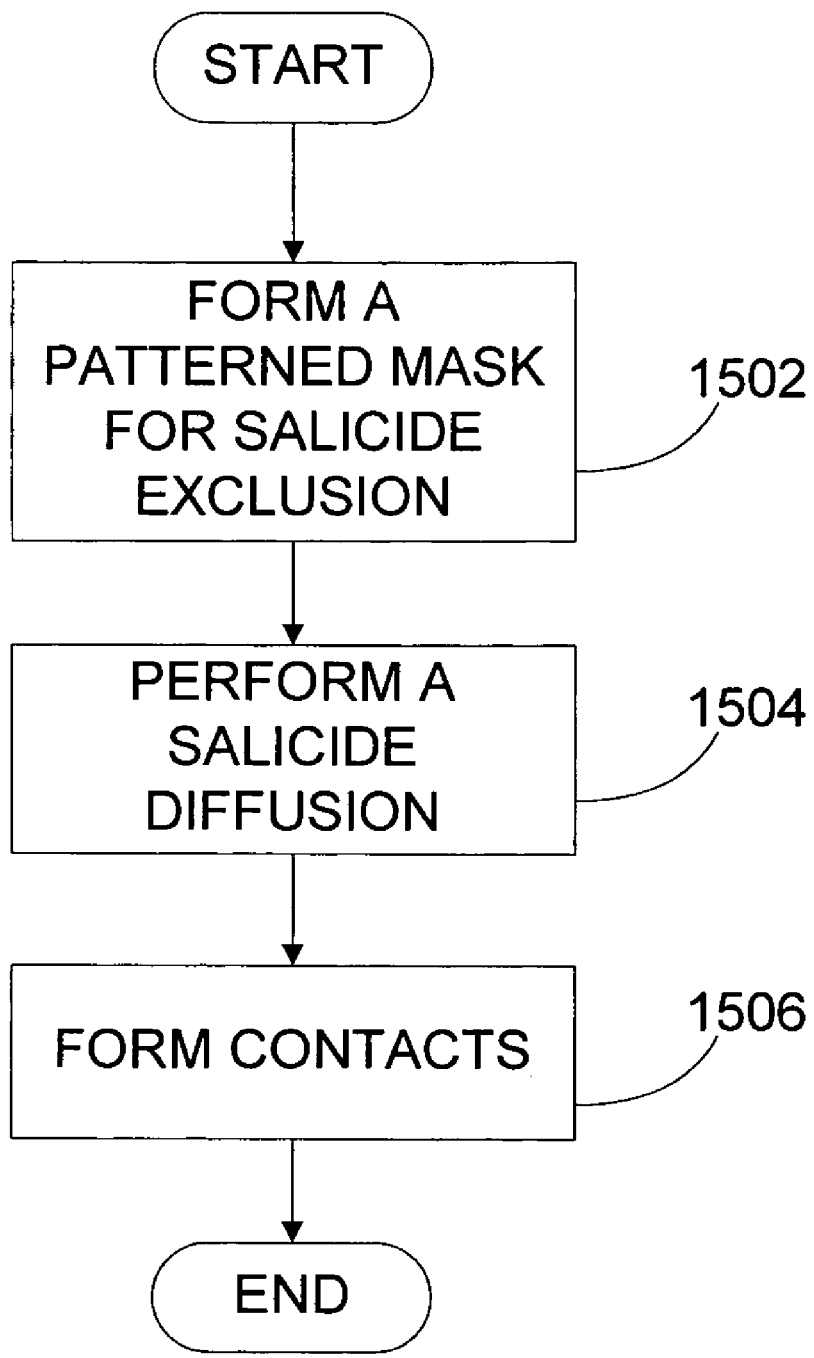
FIG. 15 is a flowchart generally illustrating a process for fabricating a device with a segmented saliside ballast.

FIG. 15 is a flowchart generally illustrating a process for fabricating a device with a segmented saliside ballast. For example, the process can be used to fabricate the snapback device described earlier in connection with FIG. 10. It will be appreciated by the skilled practitioner that the illustrated process can be modified in a variety of ways.

The description of the process begins with the gates already fabricated. The process forms 1502 a patterned mask for saliside exclusion. For example, in the embodiment described earlier in connection with FIG. 10, these masked regions correspond to the non-salisided diffusion region 1004. For example, the patterned mask can be formed using photoresist techniques. For example, the mask can be made out of photoresist and can be used to mask the deposition of metal from which the saliside layer is formed, and the mask can be removed, which removes the metal via a lift off process. In another embodiment, a hard mask, such as a mask of silicon oxide, can also be used and can remain for further processing.

The process performs a saliside diffusion 1504. For example, the saliside diffusion 1504 can follow a source/drain diffusion. In a typical saliside diffusion, a metal such as titanium, tantalum, tungsten, or the like is deposited in areas for which saliside is desirably formed, and then the substrate assembly is heated to diffuse the metal to generate the saliside. It should be noted that the term "saliside" is referred to as "self-aligned silicide" in the art, but is used herein to include both saliside and silicide, including where the saliside is patterned via a mask as shown in the illustrated process. If a photoresist mask is used, the photoresist mask should be removed prior to thermal annealing. If a hard mask is used, it can later be removed if desired.

The process then proceeds to form 1506 contacts to the underlying structures. For example, the contacts can be formed through a layer of silicon oxide. In one embodiment, the contacts are formed such that contacts 1001 straddle non-salisided or saliside-excluded regions 1004 of the same region. For example, in the embodiment described earlier in connection with FIG. 10, the contacts 1001 and the saliside-excluded regions 1004 are formed such that rows of contacts 1001 are approximately parallel to a desired direction of current flow for the drain region, and the saliside-excluded regions 1004 are formed in relatively narrow strips that are oriented such that the lengthwise axis of the narrow strips are also approximately parallel to the desired direction of current.

In one embodiment, each row of contacts 1001 is separated by a saliside-excluded region 1004. The contacts 1001 should be contact the salisided region.

Figure 16:
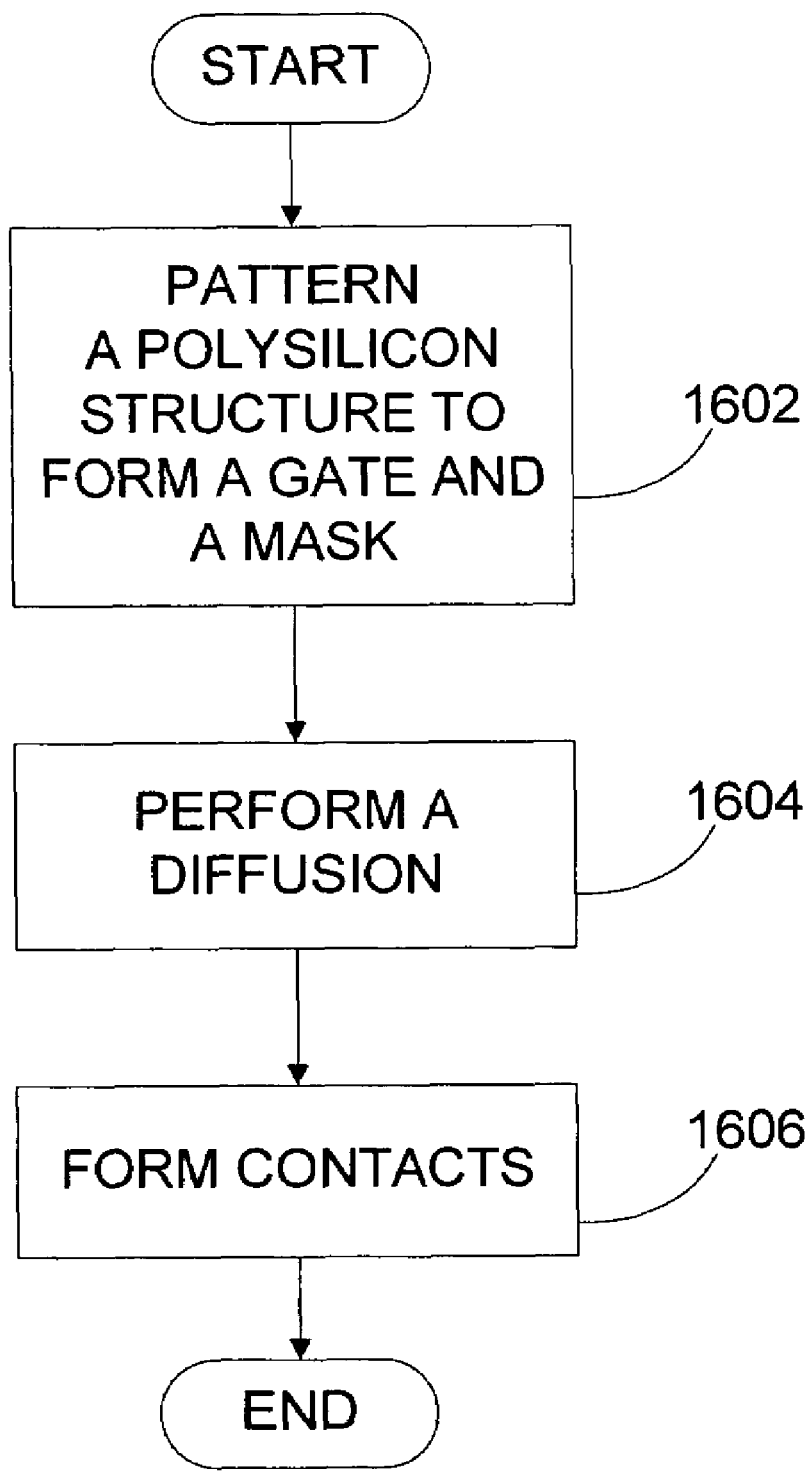
FIG. 16 is a flowchart generally illustrating a first process for fabricating a device with a poly-segmented ballast.

FIG. 16 is a flowchart generally illustrating a first process for fabricating a device with a gate material-segmented ballast, such as a poly-segmented ballast. For example, the process can be used to fabricate the snapback devices described earlier in connection with FIGS. 11 and 12. It will be appreciated by the skilled practitioner that the illustrated process can be modified in a variety of ways.

The description of the process begins with the gates already fabricated. The process will be described in the context of using polysilicon for the gate material. The polysilicon and the underlying oxide prevent the saliside from forming in underlying silicon. The process proceeds to pattern the polysilicon structure for use as a gate and a mask. In one embodiment, the mask portion made from poly is a 90 degree extension away from the poly that forms the gate. Examples of these extensions or members are illustrated in FIGS. 11 and 12. The process then performs 1604 a diffusion for at least the source and drain. In one embodiment, the process further includes a saliside diffusion after the source/drain diffusion. The mask portion of the poly prevents the source/drain diffusion and the saliside diffusion from growing underneath the poly.

The process then proceeds to form 1606 contacts to the underlying structures of the substrate assembly. In the illustrated embodiment, specific contacts to the mask portions of the poly are not needed because the mask poly is at the same potential as the gate poly.

In one embodiment, the contacts are formed such that contacts 1101/1201 straddle poly-masked of the same region. For example, in the embodiments described earlier in connection with FIGS. 11 and 12, the contacts 1101/1201 and the mask portions of the poly are formed such that rows of contacts 1101/1201 are approximately parallel to a desired direction of current flow for the drain region, and the extended poly from the gates are formed in relatively narrow strips that are oriented such that the lengthwise axis of the extensions are also approximately parallel to the desired direction of current. For example, each row of contacts 1101/1201 can be separated by an extension of poly.

Figure 17:
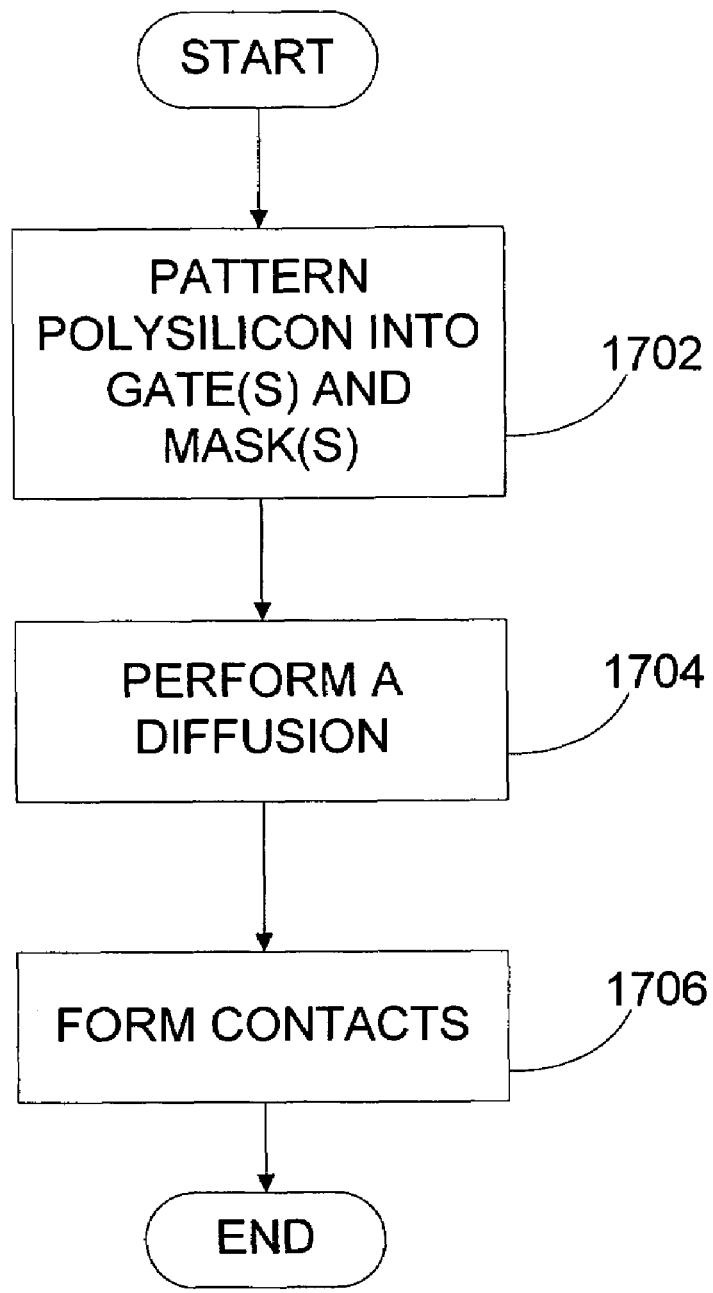
FIG. 17 is flowchart generally illustrating a second process for fabricating a device with a poly-segmented ballast.

FIG. 17 is flowchart generally illustrating a second process for fabricating a device with a gate material-segmented ballast, such as a poly-segmented ballast. For example, the process can be used to fabricate the snapback device described earlier in connection with FIG. 13. It will be appreciated by the skilled practitioner that the illustrated process can be modified in a variety of ways. The description of the process begins with the gates already fabricated. The process will be described in the context of using polysilicon for the gate material.

The polysilicon and the underlying oxide prevent the saliside from forming in underlying silicon. The process proceeds to pattern 1702 polysilicon into gate structures 1303 and mask structures 1304 as illustrated in FIG. 13.

The process then performs 1704 at least a source/drain diffusion. The source/drain diffusion is prevented from forming in the silicon underlying the gate structures 1303 and the mask structures 1304. In one embodiment, the process further includes a saliside diffusion, and the gate structures 1303 and the mask structures 1304 also prevent saliside diffusion from forming in the underlying silicon.

The process then proceeds to form 1706 contacts to the underlying structures of the substrate assembly, such as to the drains, sources, bulk, gates and the like. In addition, the contacts formed include contacts 1305 for the mask structure 1304, which is maintained at a different potential from the gate structures 1303. In one embodiment, the mask structure 1304 is tied to the voltage potential of the underlying region, such as the drain region as illustrated in FIG. 13. For example, the contact 1305 can be electrically coupled to the same potential as the drain by coupling to the same metallization 1306. It will be understood that the segmentation techniques can be applied to drain and/or to source regions.

Various embodiments of the invention have been described in this document. Although this invention has been described with reference to these specific embodiments, the descriptions are intended to be illustrative of the invention and are not intended to be limiting. Various modifications and applications may occur to those familiar with the subject without departing from the true spirit and scope of the invention as defined in the appended claims.

What is claimed is:

1. An apparatus comprising:
   a semiconductor substrate assembly;
   a gate disposed on the semiconductor substrate assembly;
   a first area on a first side of the gate, the first area having both salisided diffusion areas and at least one non-salisided area, wherein there is no polysilicon on the non-salisided areas;
   a second area on a second side of the gate; and
   contacts of the first area electrically coupled to the salisided diffusion areas, wherein at least a portion of the at least one non-salisided area is disposed between contacts of the first area that are spaced apart along a side of the gate.

2. The apparatus as defined in claim 1, wherein the first area is for a source and the second area is for a drain.

3. The apparatus as defined in claim 1, wherein the first area is for a drain and the second area is for a source.

4. The apparatus as defined in claim 1, wherein the contacts comprise sets of two or more contacts each, wherein the non-salisided areas are disposed between sets of contacts that are spaced apart from each other along the side of the gate.

5. The apparatus as defined in claim 1, wherein the second area further comprises salisided diffusion areas and at least one non-salisided area.

6. The apparatus as defined in claim 1, further comprising ballast resistors in series with the contacts electrically coupled to the salisided diffusion areas.

7. The apparatus as defined in claim 1, wherein the apparatus comprises an ESD snapback device.

8. The apparatus as defined in claim 1, wherein the apparatus comprises an output driver.

9. The apparatus as defined in claim 1, wherein at least a portion of the at least one non-salisided area is disposed in a space intersected by a line drawn between two adjacent contacts of the first area.

10. The apparatus as defined in claim 1:
    wherein the contacts of the first area comprise groups of one or more contacts, wherein each group of contacts is spaced apart along an axis orthogonal to a general direction of current flow within the first area;
    wherein the at least one non-salisided area comprises a plurality of non-salisided areas, wherein at least a portion of each of the non-salisided areas is interposed in a line along the axis between two groups of one or more contacts.

11. The apparatus as defined in claim 1, wherein the gate, the contacts, and the at least one non-salisided area are distributed across two dimensions, wherein the portion of the at least one non-salisided area that is disposed between contacts of the first area is disposed between the contacts in both dimensions.

12. An apparatus comprising:
- a semiconductor substrate assembly;
- an elongated gate disposed on the semiconductor substrate assembly, the elongated gate extending having an axis along its length;
- a first area on a first side of the elongated gate, the first area having both salisided diffusion areas and at least one elongated non-salisided area, wherein there is no polysilicon on the elongated non-salisided areas, the at least one elongated non-salisided area having an axis along its length, wherein the axis of the at least one elongated non-salisided area is orthogonal to the axis of the elongated gate;
- a second area on a second side of the elongated gate; and
- contacts of the first area electrically coupled to the salisided diffusion areas, wherein the at least one non-salisided area is disposed between contacts of the first area that are spaced apart along a side of the elongated gate.

13. An apparatus comprising:
- a semiconductor substrate assembly;
- an elongated gate disposed on the semiconductor substrate assembly, the elongated gate extending having an axis along its length;
- a first area on a first side of the elongated gate, the first area having both salisided diffusion areas and at least one non-salisided area, wherein there is no polysilicon on the non-salisided areas;
- a second area on a second side of the elongated gate; and
- contacts of the first area electrically coupled to the salisided diffusion areas, wherein at least a portion of the at least one non-salisided area lies directly between contacts of the first area that are spaced apart along a side of the elongated gate.

* * * * *